US008405318B2

(12) United States Patent
Hatakenaka et al.

(10) Patent No.: US 8,405,318 B2
(45) Date of Patent: Mar. 26, 2013

(54) LIGHT-EMITTING COMPONENT AND ITS MANUFACTURING METHOD

(75) Inventors: Michiru Hatakenaka, Nagano (JP); Takeyoshi Oba, Nagano (JP); Toshiharu Takayama, Nagano (JP); Shizuo Yamamoto, Nagano (JP)

(73) Assignee: Koa Corporation, Nagano (JP)

( * ) Notice: Subject to any disclaimer, the term of this patent is extended or adjusted under 35 U.S.C. 154(b) by 711 days.

(21) Appl. No.: 12/449,738

(22) PCT Filed: Feb. 15, 2008

(86) PCT No.: PCT/JP2008/052569
§ 371 (c)(1),
(2), (4) Date: Aug. 25, 2009

(87) PCT Pub. No.: WO2008/105245
PCT Pub. Date: Sep. 4, 2008

(65) Prior Publication Data
US 2010/0039044 A1    Feb. 18, 2010

(30) Foreign Application Priority Data

Feb. 28, 2007 (JP) ................. 2007-048795
Feb. 28, 2007 (JP) ................. 2007-048797
Feb. 28, 2007 (JP) ................. 2007-048805

(51) Int. Cl.
*H05B 37/02* (2006.01)
(52) U.S. Cl. .............. 315/291; 315/307; 315/312
(58) Field of Classification Search .......... 315/291, 315/307, 312, 179, 362, 208, 209 R, 224, 315/302, 304
See application file for complete search history.

(56) References Cited

U.S. PATENT DOCUMENTS

| 6,636,003 | B2 * | 10/2003 | Rahm et al. ............. 315/179 |
| 7,170,234 | B2 * | 1/2007 | Chikugawa et al. ...... 315/209 R |
| 7,462,994 | B2 * | 12/2008 | Inagaki et al. ............. 315/291 |
| 7,626,346 | B2 * | 12/2009 | Scilla ............................ 315/309 |

FOREIGN PATENT DOCUMENTS

| JP | 2-063133 A | 3/1990 |
| JP | 11-054804 A | 2/1999 |
| JP | 2001-272938 A | 10/2001 |
| JP | 2005-064445 A | 3/2005 |
| JP | 2005-252211 A | 9/2005 |
| JP | 2006-237409 A | 9/2006 |

OTHER PUBLICATIONS

Copy of International Search Report mailed on May 20, 2008 for the corresponding International patent application No. PCT/JP2008/052569 (English translation enclosed).

* cited by examiner

*Primary Examiner* — James H Cho
(74) *Attorney, Agent, or Firm* — Posz Law Group, PLC

(57) ABSTRACT

In a light emitting component, a resistor element is formed on the back surface of a substrate and its resistance value is adjusted to make the light intensity of a light emitting element (LED) in a predetermined range. A constant electric current circuit comprised of the resistor element and a transistor supplies the constant electric current to an LED, and the LED and the transistor are formed on a unit insulating substrate. In the case where the unit insulating substrate is rectangular in shape, one pair of opposite sides are x in length, the other pair of opposite sides are y in length and the ratio value of x/y is in the range of 1-1.25. Further, this light emitting component is provided with two resistor elements and both resistor elements are subjected to a resistor value adjustment.

9 Claims, 12 Drawing Sheets

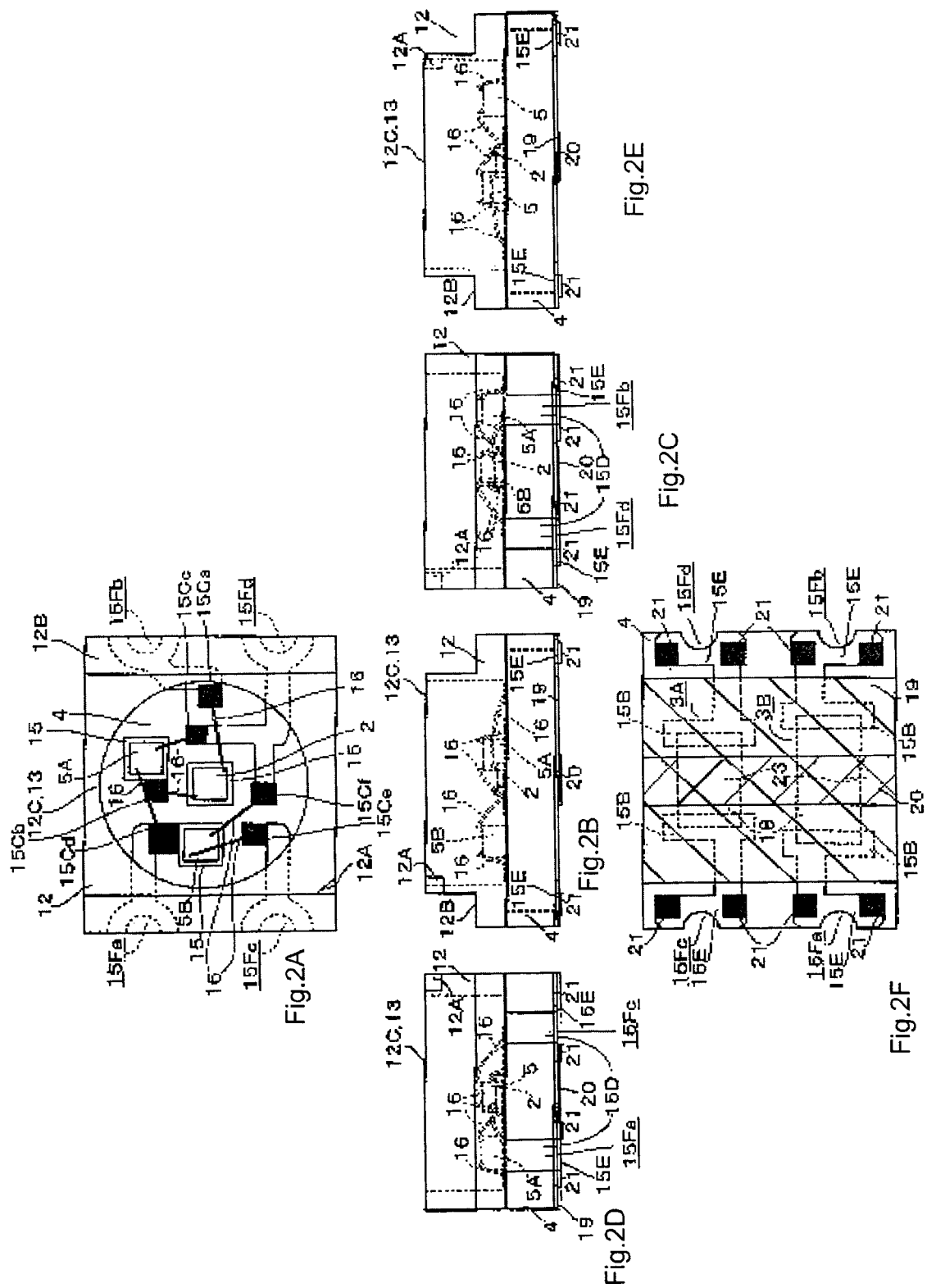

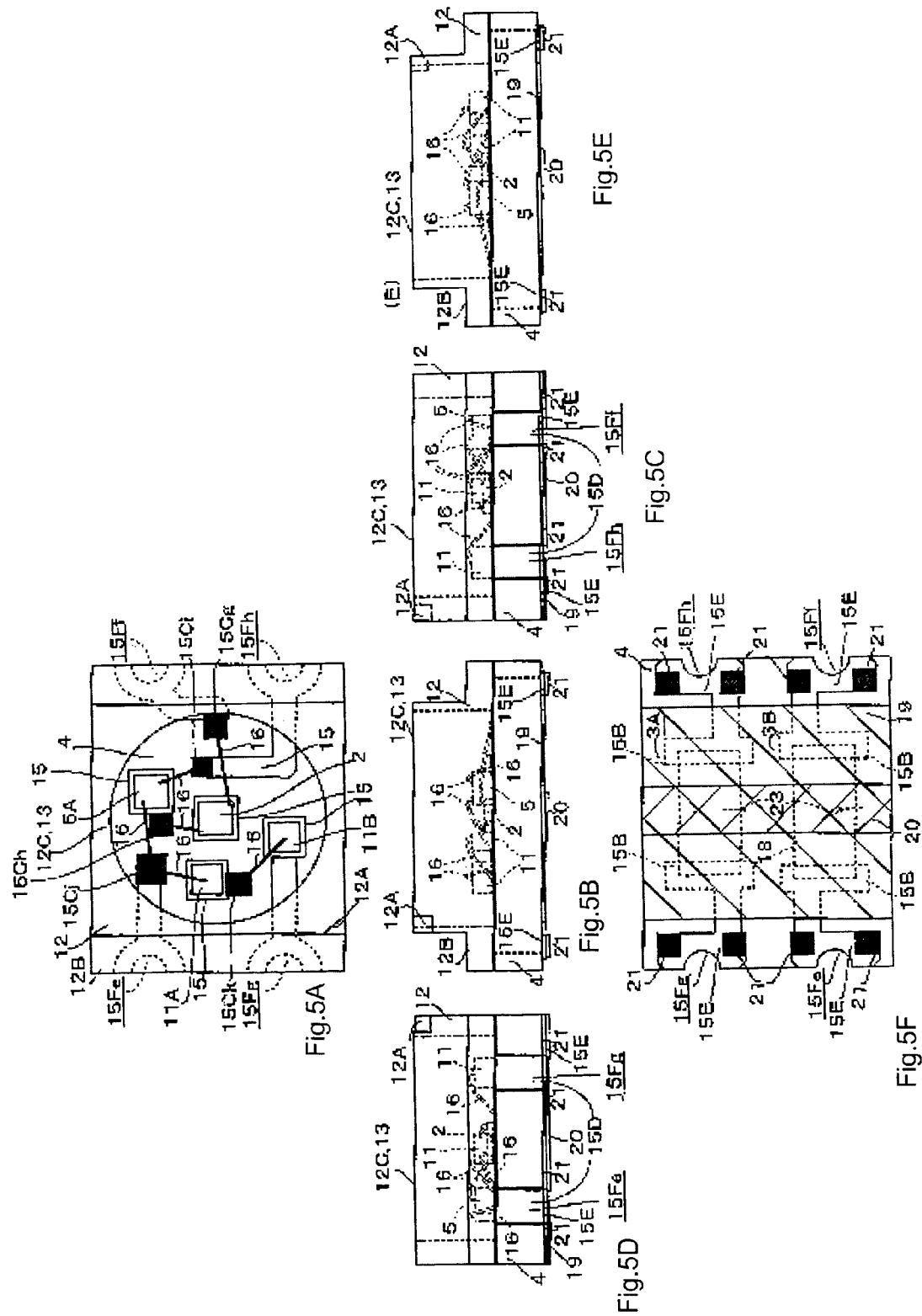

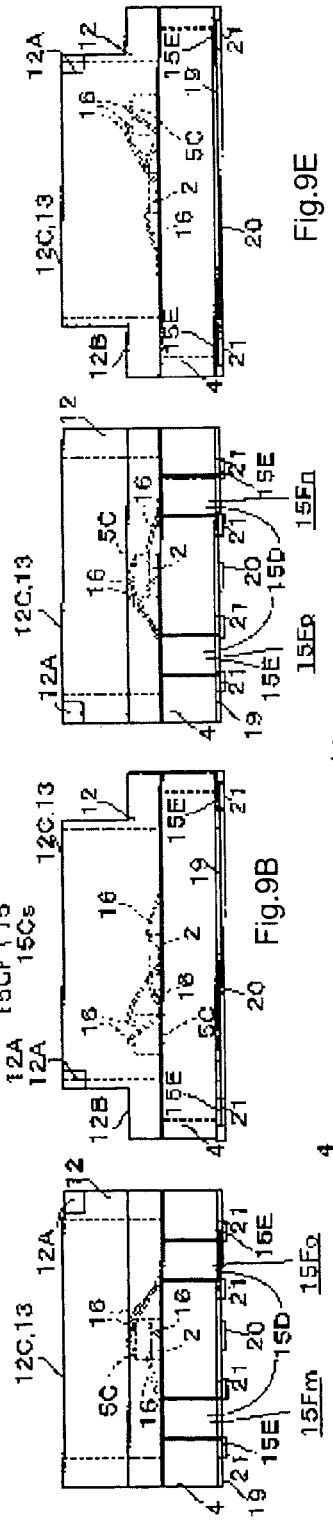

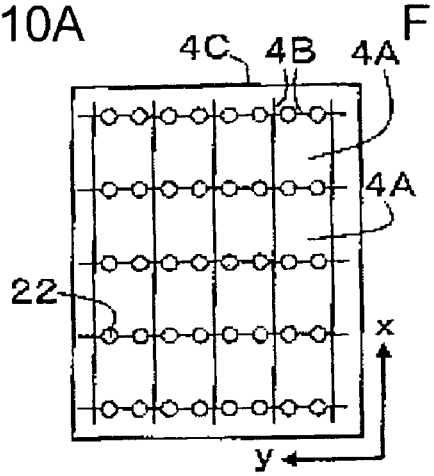
Fig.10A
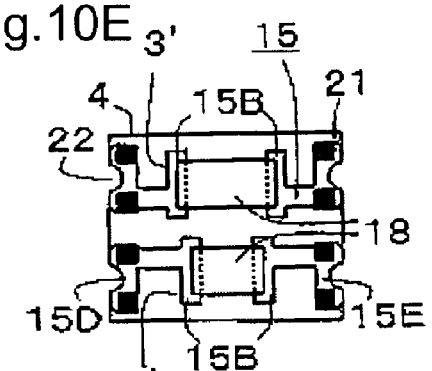
Fig.10E
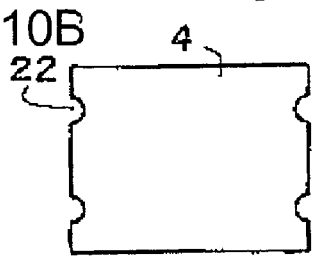
Fig.10B
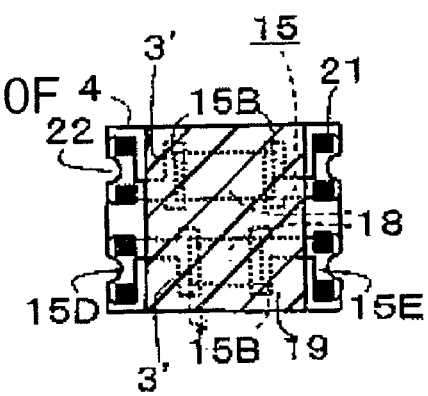
Fig.10F
Fig.10C
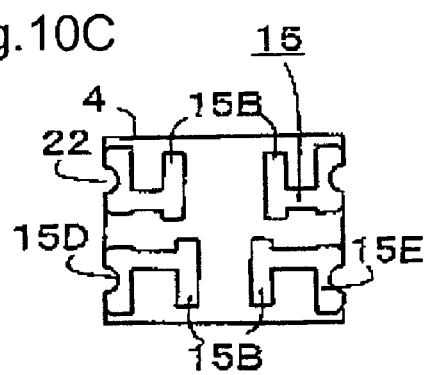
Fig.10G
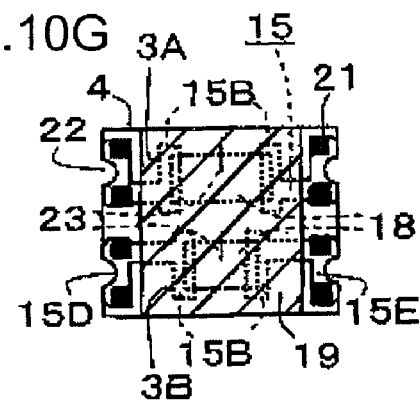
Fig.10D
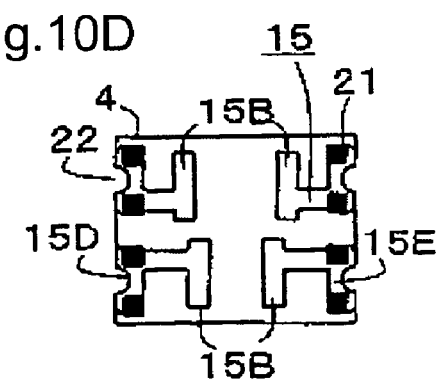
Fig.10H
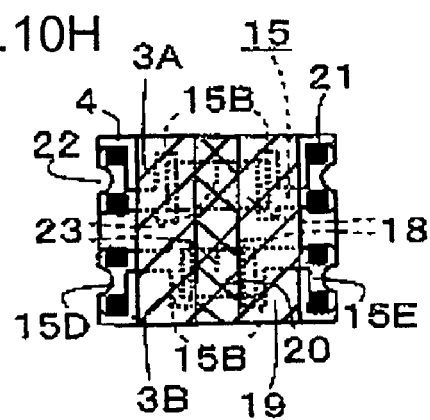

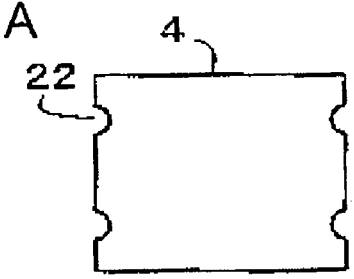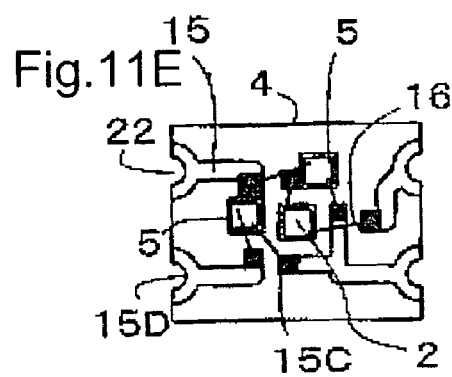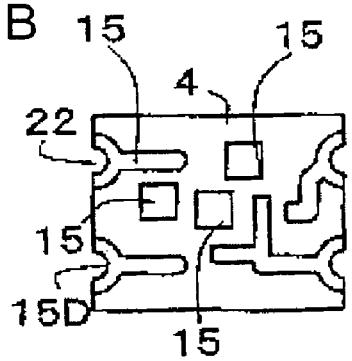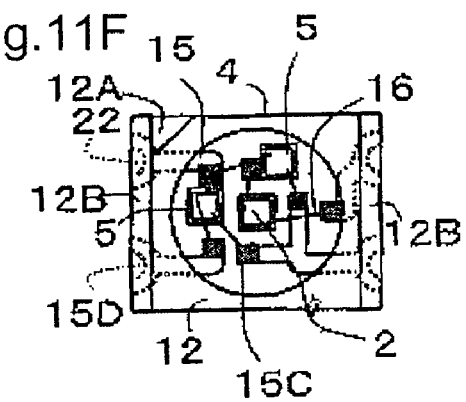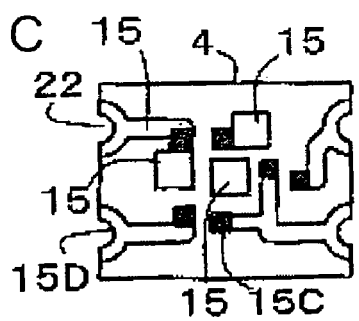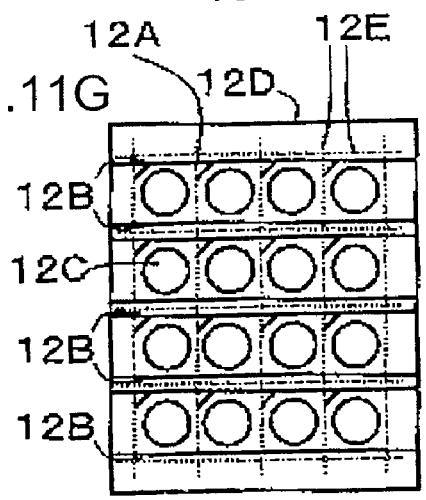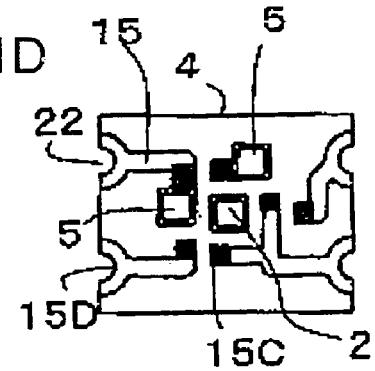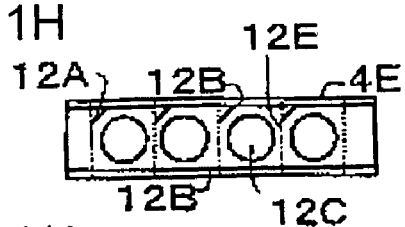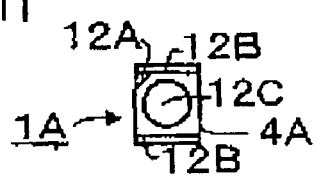

LIGHT-EMITTING COMPONENT AND ITS MANUFACTURING METHOD

BACKGROUND OF THE INVENTION

1. Technical Field

The present invention relates to a light emitting component and its manufacturing method.

2. Related Art

Light emitting components like Light Emitting Diode (LED) have been used in wide applications. However these components had a problem of variation in the final luminance due to difference in voltage to be applied (Vf) or forward current (If) even after sorting. To reduce such variation of luminance, a technology has been proposed to put a resistor in series with LED and apply a specified voltage to the set of the resistor and the LED, so as to trim resistance value through detection of LED luminance with a photoreceiver (see Patent Reference 1).

Patent Reference 1: Published Unexamined Patent Application JP2006/237409

DISCLOSURE OF THE INVENTION

Problems to be Solved by the Invention

Even a specified voltage is applied to the light emitting components; the values of Vf are normally dispersed widely, so that drive with a specified voltage is insufficient to control variation in luminance.

On the other hand, pluralities of such light emitting components are often used in parallel. Moreover, according to the use of light emitting components, light-emitting elements are sometimes required to closely arrange. For example, in the case of obtaining high light intensity per unit area, the requirement of arranging light-emitting elements closely is improved. Light emitting components with luminance variation are not suitable for such application.

The problem to be solved by the invention is to provide a light emitting component suitable for close and multiple arrangement as well as to reduce variation in light intensity.

Means to Solving the Problems

In order to solve the above mentioned problems, a light emitting component of the invention comprises a light emitting element; a resistor element with a resistance value adjusted to produce light intensity of the light emitting element within a specified range, and formed on the back surface of a substrate; a constant current circuit including the resistor element and a transistor and/or a diode to supply a constant current to the light emitting element, the circuit formed on the surface of the said substrate; and the substrate in rectangular shape having the range of side length ratio x/y between 1 and 1.5, wherein x is the length of a pair of opposite sides and y is the length of the other pair of opposite sides of the substrate.

In this component, the constant current circuit ensures a constant current to the light emitting element and the resistor element has a resistance value adjusted to produce light intensity of the light emitting element within a specified range, thereby variation in light intensity of light emitting element is more reduced than constant voltage drive. The constant current circuit formed on both sides of a substrate realizes downsizing of component. The shape of the substrate is square or rectangle close to square having a side length ratio between 1 and 1.5, thereby light emitting elements can be arranged closely on a substrate. Then a light emitting component with a plurality of light emitting elements in a dense arrangement can be provided.

Another claim of the present invention comprises the above mentioned construction, wherein the component has a plurality of resistor elements, thereby stable constant current circuit with a plurality of resistor elements can be provided.

Another claim of the present invention comprises the above mentioned construction, wherein a hollow member with a penetrating holes is bonded on the surface of the substrate, the penetrating hole standing against the surface of the substrate, and the resistor element, the transistor and/or the diode are placed within the penetrating hole, thereby the direction of light beams emitted from the light emitting element is concentrated to the opening of the penetrating hole on the opposite side of the surface of the substrate, so as to prevent light beams from emitting to unintentional directions.

Another claim of the present invention comprises the above mentioned construction, wherein the resistor element having a thick resistance film contacting a pair of resistor terminals at two portions, and an overcoat film protecting the resistor element to be formed on the resistance film except the parts of the resistor film contacting the resistor terminals, thereby loose packing of a number of the light emitting components in a bag is available as well as bulk supply with a parts bowl. This construction also allows easy bonding between the external terminals of the component and the lands on a circuit board even if the portions contacting the resister film with the resistor terminals are placed on the mounting surface of the light emitting component.

Another claim of the present invention comprises the above mentioned construction, wherein the resistor element is electrically connected with the light emitting element or the transistor and/or the diode at an end of the substrate, thereby easy electric connection between them is realized without preparation of additional holes on the substrate.

Another claim of the present invention comprises the above mentioned construction, wherein the constant current circuit has a positive input terminal and a negative input terminal, putting two branching transmission lines between the terminal, the first transmission line having a light emitting element, the first NPN transistor and the first resistor in order of the positive input terminal, the first NPN transistor having emitter terminal laid closer to the negative input terminal than collector terminal; the second transmission line having the second resistor element and the second NPN transistor in order of the positive input terminal, the second NPN transistor having emitter terminal laid closer to the negative input terminal than collector terminal; the third transmission line put on the first junction between the second resistor element and the second NPN transistor to be connected to the base of the first NPN transistor; and the fourth transmission line put on the second junction between the first NPN transistor and the first resistor to be connected to the base of the second NPN transistor; thereby a practical constant current circuit is realized with less number of parts.

Another claim of the present invention comprises the above mentioned construction, wherein the constant current circuit has a positive input terminal and a negative input terminal, putting two branching transmission lines between the terminals, the first transmission line having a light emitting element, a NPN transistor and the first resistor element in order of the positive input terminal, the NPN transistor having emitter terminal laid closer to the negative input terminal than collector terminal; the second transmission line having the second resistor element and a plurality of diodes in order of the positive input terminal, each of the diodes having anode and cathode terminals along with the direction from the positive input terminal to the negative input terminals; the third transmission line put on the first junction between the second resistor element and the diodes to be connected to the base of the NPN transistor; thereby another practical constant current circuit is realized with less number of parts.

Another claim of the present invention comprises the above mentioned construction, wherein the constant current circuit has a positive input terminal and a negative input terminal putting two branching transmission lines between the terminals, the first transmission line having a light emitting element, a NPN transistor and the first resistor in order of the positive input terminal, the NPN transistor having emitter terminal laid closer to the negative input terminal than collector terminal; the second transmission line having the second resistor element and a Zener diode in order of the positive input terminal, the Zener diode having anode and cathode terminals along with the direction from the negative input terminal to the positive input terminal; the third transmission line put on the first junction between the second resistor element and the Zener diode to be connected to the base of the NPN transistor; thereby further different constant current circuit is realized with less number of parts.

Another claim of the present invention comprises the above mentioned construction, wherein the constant current circuit has a positive input terminal and a negative input terminal, putting a light emitting element and a n-channel field effect transistor in order of the positive input terminal between the terminals, gate and source terminals of the field effect transistor short-circuited through the resistor element, thereby another practical constant current circuit is realized with less number of parts.

In order to solve the above mentioned problems, a manufacturing method for light emitting component of this invention comprises resistor forming process to place an in-process resistor element with unadjusted resistance value on the back side of each unit substrate partitioned with crosswise border lines on a mother insulating substrate, the unit substrate having the ratio of x/y between 1 and 1.5, x being the length of one pair of opposite sides of the unit substrate and y being the length of the other pair of opposite sides of the unit substrate; assembly process of a light emitting element and one or more transistors and/or one or more diodes on the surface of each unit substrate; conductor forming process to form conductors connecting the in-process resistor element, the light emitting element, the transistor(s) and/or the diode(s) respectively so as to constitute a constant current circuit on each unit substrate; trimming process to trim resistance value of the in-process resistor element on each unit substrate after the above assembly and conductor forming processes in order to adjust light intensity of the light emitting element on each unit substrate within a specified range; and dividing step to divide the said mother insulating substrate into individual unit substrates.

In this manufacturing method, the constant current circuit formed through the assembly process and the conductor forming process supplies constant current to the light emitting element. In the trimming process, the in-process resistor element is adjusted resistance value to put light intensity of the light emitting element within a specified range, thereby the variety of light intensity among the light emitting elements on the mother insulating substrate is reduced. The constant current formed on both sides of each unit substrates through the assembly process and the conductor forming process realizes a light emitting component with compact substrate. Square or semi-square unit substrates with a value between 1 and 1.5 as the side ratio x/y, the shape identical to or close to square, can make adjoining light emitting elements close, thereby a compact light emitting component array with dense package of a plurality of light emitting elements is provided. Further the manufacturing method including the assembly process, the conductor forming process and the dividing process for a mother insulating substrate with crosswise borders, makes the manufacture of the said light emitting component efficient.

Another manufacturing method of the invention according to the said method, comprises a bonding process to bond a mother hollow member with a plurality of penetrating holes on the surface of the mother insulating substrate before the assembly process, each penetrating hole standing against the surface of each unit substrate; and the dividing process to add division of the hollow member into individual unit hollow members. This manufacturing method realizes effective production of the light emitting component with this manufacturing method concentrates light emission directions from the light emitting element into the opening opposite to the surface of the unit substrate, thereby light emission to unintentional directions is controlled.

Another manufacturing method of the invention according to the said method, comprises the resistor forming process to place a plurality of in-process resistor elements with unadjusted resistance value on the back side of each unit substrate partitioned with crosswise border lines on a mother insulating substrate, and the trimming process to trim resistance values for two or more of the resistor elements, thereby many constant current circuits with a plurality of resistor elements are easily formed on a mother insulating substrate.

Effect of the Invention

The present invention effectively reduces variation in light intensity among light emitting elements like LED as well as can provide a light emitting component array with dense package of a plurality of light emitting elements.

BRIEF DESCRIPTION OF THE DRAWINGS

FIG. 2 shows six projection views of the above component, wherein FIG. 2 A is plan view, FIG. 2 B front view, FIG. 2 C right side view, FIG. 2 D left side view, FIG. 2 E back view and FIG. 2 F bottom view respectively, FIGS. 3 A, 3 B, 3 C, and 3 D are examples of a typical constant circuit diagram for the above component.

FIG. 5 shows six projection views of the component shown in FIG. 4, wherein FIG. 5 A is plan view, FIG. 5 B front view, FIG. 5 C right side view, FIG. 5 D left side view, FIG. 5 F back view and FIG. 5F bottom view respectively.

FIG. 9 shows six projection views of the component shown in FIG. 4, wherein FIG. 9 A is plan view, FIG. 9 B front view, FIG. 9 C right side view, FIG. 9 D left side view, FIG. 9 E hack view and FIG. 9 F bottom view respectively.

FIG. 10 shows a manufacturing process of a light emitting component according to the invention, wherein FIG. 10 A is the bottom view of a mother insulating substrate with crosswise borders and each of FIG. 10 B to FIG. 10 H is the bottom view of a unit substrate in each manufacturing step.

FIG. 11 shows a manufacturing processes of another light emitting component according to the invention, wherein each of FIG. 11 A to FIG. 11 E is the surface view of a unit substrate in each manufacturing process, FIG. 11 F is the surface view of a unit substrate after the bonding process, FIG. 11 G is the plan view of the mother insulating substrate, FIG. 11 H is a strip divided from the mother substrate, and FIG. 11 I is a unit substrate separated from the strip.

Figure 1:
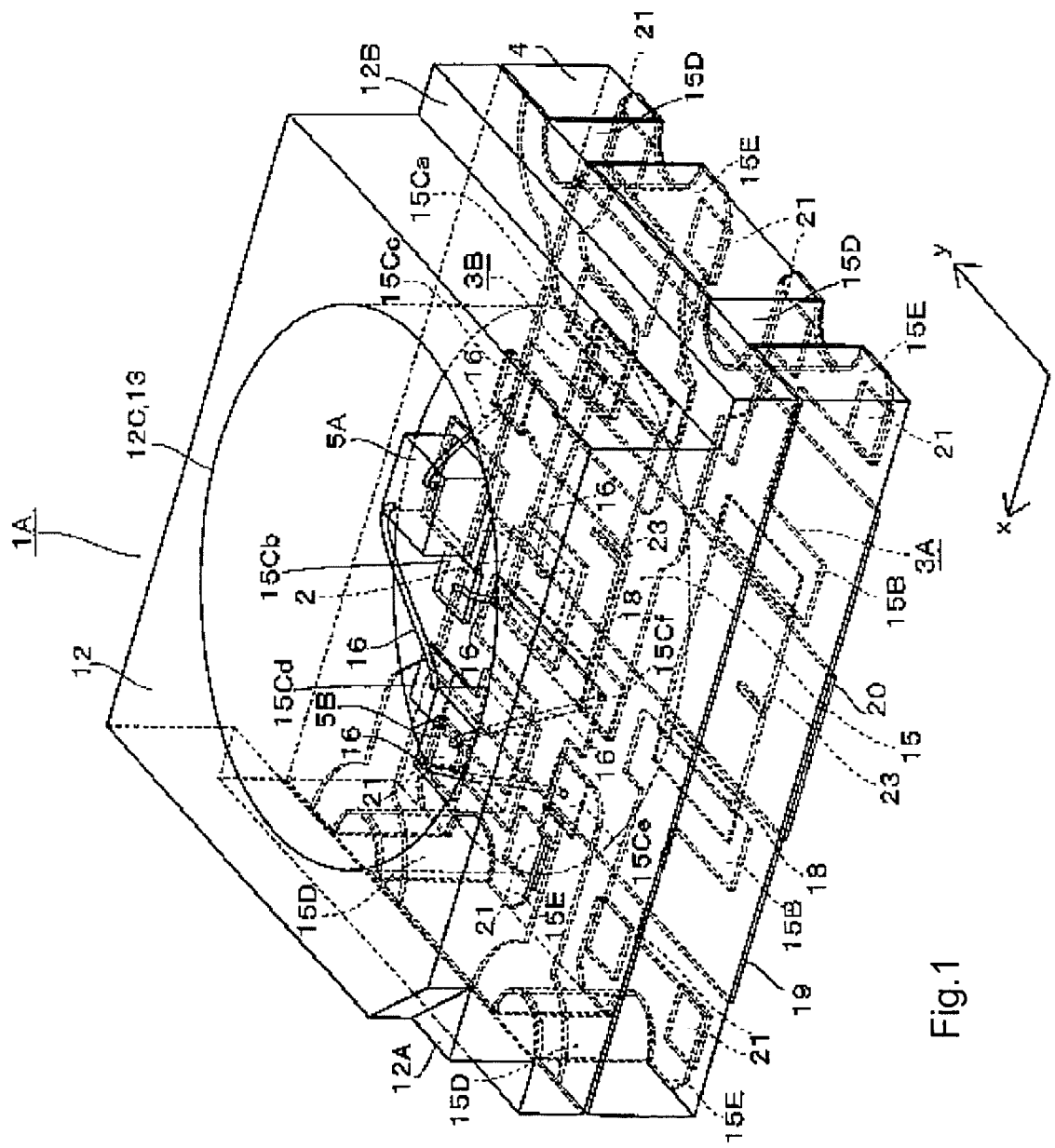
FIG. 1 shows a perspective view of a light emitting component according to an embodiment of the invention.

DESCRIPTION OF SIGNS 1A, 1B, 1C, 1D: Light emitting component
2: LED
3, 3A, 3B, 3C: Resistor element
4: Substrate
4A: Unit substrate
4B: Border line
4C: Mother insulating substrate with borders
5, 5A, 5B: NPN transistor (Transistor)
5C: Field effect transistor (Transistor)
6, 6A, 6B, 6C, 6D: Constant current circuit
7: Positive input terminal
8: Negative input terminal
9A: First transmission line
9B: Second transmission line
9C: Third transmission line
9D: Fourth transmission line
10A: First junction
10B: Second junction
11, 11A, 11B: Diode
11C: Zener diode
12: Unit hollow member
12C: Penetrating hole
12D: Mother hollow member
13: Cavity
15, 15A: Conductor

BEST MODE FOR CARRYING OUT THE INVENTION

Some preferred embodiments of light emitting component according to the invention are described hereunder. In the description, construction members and constant current circuit members are explained separately referring to each figure, and the function of the light emitting component is explained together with the constant current circuit. Manufacturing methods of light emitting component according to the invention are described later.

FIG. 1 shows a perspective view of a light emitting component as an embodiment of the invention, and FIG. 2 shows six projection views of the above component, wherein FIG. 2 A is plan view, FIG. 2 B front view, FIG. 2 C right side view, FIG. 2 D left side view, FIG. 2 E back view and FIG. 2 F bottom view respectively.

The construction of this light emitting component 1A is described below. The component 1A comprises a light emitting element (LED2), resistor elements 3, transistors 5 and a substrate 4 on which these elements are placed. The resistor elements 3 (including 3A and 3B in this embodiment) are adjusted so as to make light intensity of the LED 2 within a specified range and placed on the back surface of the substrate 4. These resistor elements 3A and 3B, and further 3C described later, may collectively be referred to as resistor elements 3 as required. The LED 2 and the transistor 5 are both placed on the surface of the substrate 4, while a constant current circuit consisting of the resistor elements 3A and 3B and the transistors 5A and 5B is formed on both sides of the substrate 4. These transistors 5A and 5B, and further field effect transistor 5C described later, may collectively be referred to as transistors 5 as required. This constant current circuit supplies a constant current to the LED 2. The substrate 4 is rectangular shaped with the side ratio x/y as high as 1.25, x being the length of one pair of opposite sides of the substrate and y being the length of the other pair of opposite sides of the substrate. This light emitting component 1A has two resistor elements 3, each of the elements 3A and 3B having a trimmed resistance value.

(Each Construction Member)

The substrate 4 as the base of the light emitting component 1A is made of rectangular alumina ceramics having semicircular recesses on each of one pair of opposite sides (2 recesses on each side in this embodiment). Assuming the length of each of the sides being y (2.8 mm) and the length of each of the other pair of sides being x (3.5 mm), the side ratio x/y is determined as 1.25. The substrate 4 is 1.5 mm thick. Another material other than alumina ceramics such as ceramics including aluminum nitride, or a resin including a glass-fiber-reinforced epoxy resin, is also available for the substrate 4.

The substrate 4 is assembled on the surface with a hollow member 12, a light-permeable resin (not illustrated) to be filled in the penetrating hole 12C of the hollow member 12, and elements to be covered with the resin including the transistors 5, conductors 15, pads 15Ca, 15Cb, 15Cc, 15Cd, 15Ce and 15Cf, and bonding wires (gold wire 16) to electrically connect among the LED 2, the transistors 5 and the pads 15Ca, 15Cb, 15Cc, 15Cd, 15Ce and 15Cf. The substrate 4 is further formed or placed with 4 back terminals 15E on the back surface, each of which is placed on each of the semicircular recesses, bumps 21 each of which is placed on each of the back terminals 15E, two pairs of T-shaped resistor terminals 15B extended from each back terminal 15E, resistor films 18 placed on each mate of the paired resistor terminals 15B, glass film 19 covering the whole area of the resistor films 18 and most of the resistor terminals 15B, trimming channels 23 formed on the resistor films 18 and the glass film 19, and an overcoat 20 protecting the trimming channels 23. The substrate 4 is additionally provided on sides with side terminals 15D electrically connecting each of the back terminals 15E and each of the conductors 15 in individual semicircular recesses on the two sides.

The hollow member 12 having a circular penetrating hole 12C is rectangular at the plan view and each side in directions x and y has length value equal to the corresponding side of the substrate 4. The hollow member 12 is made of resin compact of a polymer liquid crystal resin and bonded on the surface of the substrate 4. This resin has good radiation performance so that the hollow member 12 is good at radiating heat of the resistor elements or the transistors 5 in order to maintain their performances. Polyphenylene sulfide (PPS) or polyphenylene ether (PPE) is also available for a substitute of the polymer liquid crystal resin.

On the hollow member 12, the circular penetrating hole 12C is opposite to the surface of the substrate 4, so that the hole 12C serves as cavity 13 having the surface of the substrate 4 as the bottom. For another material common to the hollow member 12 having the cavity 13 and the substrate 4, LTCC (Low Temperature Co-fired Ceramics) including a glass element as well as ceramics is suitable if a part corresponding to the substrate 4 and another part corresponding to the hollow member 12 including the cavity 13 are formed integrally and fired. In this process, the cavity 13 is integrated with the substrate 4. Shape and dimensions of the cavity 13 are determined according to the shape of the light emitting component 1A, number of parts used to the driving circuit for LED 2 and put in the cavity 13 including transistors 5, specification of the light emitting component 1A, and the strength of the hollow member 12. The shape of the penetrating hole 12C can be selected from cylinder, truncated cone and rectangular solid.

The hollow member 12 has a cutout at one of four corners on the top surface as Cathode Mark 12A. This Cathode Mark 12A indicates the direction of the light emitting component 1A to mount to a circuit board. The Cathode Mark 12A is critical to the light emitting component 1A having a square or semi-square substrate 4. The hollow member 12 also has two thin wall parts 12B on one pair of minor sides (in y direction), which facilitate the dividing step described later.

A conductor island 15, provided on the surface of the substrate 4 in the center of the bottom of the cavity 13 and separate from other lands 15, has a LED 2 so that the light emitting surface points the top opening of the cavity 13. This arrangement of the LED 2 in the center of the cavity 13 and a driving circuit surrounding the LED 2 is effective to concentrate light emission into the top opening and to control it to unintentional directions.

The position of the LED 2 can be a little deviated from the center of the cavity 13. The arrangement of the LED 2 to the center of the cavity 13' bottom surface means that the LED 2 is placed on the bottom surface of the cavity 13 to cover the center of the cavity circle as shown in FIG. 2A. This arrangement uniformly reflects light beams from the LED 2 on the wall of the cavity 13 without segregation. The arrangement of the transistors 5 and the pads 15Ca to 15Cf surrounding the LED 2 also allows dispersion of light beam reflection to various directions to make uniform distribution of reflected light.

Where the LED 2 is placed so that the light emitting surface points the top opening of the cavity 13, it is preferred to form light reflector layer inside the cavity 13 (the wall and the bottom surface). The reason is to facilitate reflection of emitted light in the cavity so as to prevent light intensity of the component 1A from attenuating. For the light reflector layer, thin film formation techniques such as plating or sputtering, and application of a metal foil are available. For the material of the light reflector layer, a metal can be selected from nickel, copper, gold, silver, titanium and platinum. Combination of two or more metal layers or an alloy of two or more metals selected from the elements is also available.

The LED 2 is placed in the center of the substrate 4, which means that the LED 2 covers the intersection two diagonals for the rectangular substrate 4 in the plan view. An advantage of this layout is that a plurality of LEDs 2 can be placed at equal intervals in the combination of multiple light emitting components 1A, thus natural light emission is realized. This advantage is independent of whether the LED 2 is placed on the bottom of the cavity 13. Another way to obtain this advantage is to place each LED 2 on the same position of each substrate 4. However in this layout, every component 1A must be aligned in the same direction to mount to a circuit board.

In this embodiment of the invention, the LED 2 is used as the light emitting element. On the other hand, another light emitting element, like a semiconductor laser element, an electro-luminescence element or a fluorescent tube can be used instead.

Parts of the LED 2 driving circuit on the light emitting component 1A, including the transistors 5, the conductors 15, the pads 15Ca to 15Cf connected to the conductors 15, and the gold wires 16 connecting the LED 2, the transistors 5 and the pads 15Ca to 15Cf, are placed around the LED 2. This layout reflects the light beams from LED 2 at the transistors 5, the conductors 15 and the pads 15Ca to 15Cf without segregation as described above, so as to reduce the variation in light intensity of the component 1A. This layout also facilitates light dispersion to prevent attenuation of light intensity in the light emitting direction and widens light emitting point of the component 1A with the dispersed light, so that natural light emission is realized with an array of multiple light emitting components 1A.

The above effect is also obtained with another circuit including diodes 11A and 11B (these diodes and sometimes together with a Zener diode 11C described later, are from time to time referred to as "diodes 11") to be placed around LED 2 as parts of the circuit driving the LED 2 on another light emitting component 1B or 1C described later (refer to FIGS. 4, 5, 6 and 7). The effect is further obtained with a different circuit including a field effect transistor 5C to be placed around LED 2 as a part of the circuit driving the LED 2 on another light emitting component 1D (refer to FIGS. 8 and 9). The layout used to each of the light emitting components 1A, 1B, 1C and 1D, on which driving circuit parts are place over 180 degrees wide around the LED 2, disperses light from the LED 2 without segregation.

The transistors 5 and/or the diodes 11, placed around the LED 2 and constituting its driving circuit, are preferably lower than the LED 2 in the height, so that light intensity of the LED 2 is facilitated to calculate and the directionality of the light is reduced, that is variation in the intensity of light from the LED 2 is reduced. However a layout of taller transistors surrounding the LED 2 is also preferable to disperse light. The wall inside the cavity 13 of the hollow member has the effect to reflect and disperse light beams from the LED as described above. The layout of the transistors 5 and/or the diodes 11 surrounding the LED 2 facilitates wire bonding work between them with gold wires 16.

All or part of the transistors 5 and other circuit parts can be placed other than in the cavity 13, while the light emitting component 1A has such elements all in the cavity 13. This variation is also applicable to any of the light emitting components 1B, 1C and 1D, including the diodes 11 or a field effect transistor 5C as parts of the driving circuit for the LED 2.

The transistors 5 and the LED 2 for the light emitting component 1A are normally connected with gold wires 16 using "wire-bonding" method, and "flip chip bonding" method can be used alternatively. For the latter method, bumps are formed on the back surface of the component 1A in order to make electric wiring between the transistors 5 and the LED 2.

The cavity 13 is filled with a light-permeable resin (not illustrated in drawings), which protects electric connection between the LED 2, the transistors 5 and the gold wires 16. The resin only exists inside the cavity 13. In this embodiment, a silicone resin is used to suppress degradation of the resin where the light beams from the LED 2 include much wave element with ultraviolet wavelength range. Another type of resin like epoxy resin can be used according to specifications, applications and light intensity of the component 1A. Optical transmittance of the resin is modified or adjusted according to specifications, applications and light intensity of the component 1A. The light-permeable resin is filled only in the cavity 13 as described for the light emitting component 1A or covers both of inside and outside of the cavity 13. However if the resin covers both of inside and outside of the cavity 13, light emission status of the component 1A may be unstable, because the resin can have indefinite form outside the cavity 13 so as to disrupt light emission of the component 13. It is preferable to make the top surface over the hollow member flat with overflow of the resin, so as to stabilize the light emission. Spherical projection of the light-permeable resin at the top opening of the cavity 13, to serve as a convex lens, is also preferable. This construction produces focus of light beams from the LED 2 at a specified distance, so that it is effective to obtain high light intensity. On the other hand, concave surface of the resin at the top opening of the cavity 13 is effective to equalize general light intensity.

Two resistor elements 3 made of thick film are placed on the back surface of the substrate 4, and the material is substitutable with thin film. Each of these resistor elements 3 comprises resistor films 18, each of the films 18 contacting a pair of T-shaped resistor terminals 15B extended from each back surface terminal 15E as part of a conductor 15, and a resistance trimming channel 23.

In the light emitting component 1D to be described later, only one resistor element 3 with a resistor film 18 is enough for the circuit (see FIG. 3 D, FIG. 8 and FIG. 9). Otherwise multiple resistor elements 3 (3, 4 or 5 elements) with a resistor film 18 can be used instead. Further adjustable chip resistor(s) are available as well, instead of thick film resistor film.

On the back surface of the substrate 4, a thick glass film 19 is formed to cover most of the whole area on the surface except the back surface terminals 15E, the resistance trimming channels 23, and both ends of the substrate 4 in x direction, so as to protect the thick resistor films 18 and the resistor terminals 15B. Overcoat 20 made of an epoxy resin is further laid with a certain width along with y direction in the middle of the glass film 19 between the resistor terminals 15B, so as to protect the trimming channels 23. On each of the back surface terminals 15E, two bumps 21 of projected conductor are placed. The glass film 19 can be formed to cover all or part of each resistor film 18, instead of covering most of the whole area on the surface except the back surface terminals 15E.

Each of the paired resistor terminals 15B has a part to contact the thick resistor film 18 constituting each resistor element 3, and the overcoat 20 made of a thick film covers each of the resistor elements 3 to protect, except the part on each terminal 15B. Each of the part is thicker than other area on the substrate 4 since the resistor film 18 is overlapped with the resistor terminal 15B. If the light emitting component has a large projection on its shape, it is difficult to use bulk supply where many components are bagged loose and fed one by one in line with a parts bowl. If such projection is placed on the mounting surface of the component, soldering of external terminals (denoting the set of side terminals 15D, the back terminals 15E and the bumps 21 as described later) with lands on a circuit board may be hindered. Then the overcoat 20 is preferably formed excluding such projections as described for the component 1A or to be later described for the components 1B, 1C and 1D (refer to FIGS. 2F, 5F, 7F and 9F). Each of the bumps 21 has a role to ensure bonding between the external terminals and the circuit board. However in case each of the resistor elements 3 consisting of the resistor film 18 is made of a thin film and not high in the height, the overcoat 20 can be formed to cover most of the whole area of the back surface on the substrate 4. In this case, at least the bumps 21, and preferably the back surface terminals 15E, are required to expose from the overcoat 20.

Each of the resistor elements 3 constituting the light emitting component 1A and placed on the back surface of the substrate 4, is electrically connected with the LED 2 and other driving circuit members (the conductors 15, the pad 15Ca to 15Cf, and the transistors 5) placed on the surface of the substrate 4, through each of four side terminals 15D provided within semicircular conductor columns on two sides of the substrate 4. This construction is effective to realize electric connection between the resistor elements 3 on the back surface and the LED 2 or the other circuit members (e.g. the transistors 5 and/or the diodes 11) on the surface without preparing an additional through-hole on the substrate 4. However such electric connection can be made through the sides other than the above sides of the substrate 4 with the semicircular conductor columns, or with electric wires like the gold wires 16 extended through one or more through-holes formed within the substrate 4, instead of the above method.

Another advantage of the above side terminals 15D provided within semicircular conductor columns is to facilitate the production of the light emitting component 1A. In a through-hole printing method described later, the side terminals 15D are formed together with other terminals constituting the resistor elements 3, whereby a separate step to form the side terminals 15D on two sides of the substrate 4. Through a dividing step to divide a mother insulating substrate along with border lines running in the center of the circular through-holes as described later, unit substrates 4 having semicircular columns including the side terminal 15D on two sides are obtained. Another solid figure such as rectangular or semi-oval column is also available for the base of the side terminal 15D, if it can be prepared with the through-hole printing method described later.

On each of the external terminals 15Fa to 15Fd including the side terminals 15D, nickel and solder layers (not illustrated) are formed in this order with a barrel plating method described later, in order to improve solderability of the terminals against the lands on the circuit board of the light emitting component 1A. Each of the external terminals 15Fa to 15Fd has the side terminal 15D, the back surface terminal 15E and the bumps 21, for external electric connection. In a barrel plating method, a number of light emitting component 1A are put into a barrel together with metal particles referred to as dummy balls, then the barrel is immersed into solder bath as rotating or vibrating and electrified. Plating rate depends on the provability of the terminals 15Fa to 15Fd to contact with the dummy balls, the provability increasing with more complexity in the shape of each terminal. The external terminals 15Fa to 15Fd including the semicircular side terminals 15D improves the plating rate because of their complexity in shape.

Each of the side terminals 15D is formed on the inner surface of each semicircular column, so that it is recessed against the side surface of the substrate 4. Then the light emitting component 1A is protected from damage of the side terminals 15D due to hitting with another element on mounting to circuit board with a chip mounting machine. This effect is enhanced by the hollow member 12 made of a resin and placed on the substrate 4, which has side surfaces on the same plane as the bulk surfaces of the substrate 4 other than the semicircular side terminals 15D. The side surfaces of the hollow member 12 prevent the side terminals 15D from approaching other things, so as to reduce the provability of damage. The hollow member 12 made of a resin also protects the side terminals 15D from physical shock with the plasticity of the resin. The bottom surface of the hollow member 12 also shields each of the semicircular side terminals 15D at the top from other things. This construction isn't preferable if the side terminals are prepared with a through-hole printing method to be described later, because the thickness of each terminal is low and easy to be damaged.

Each of the external terminals 15Fa to 15Fd has nickel and solder layers in this order on the surface as described above (not illustrated). The solder layer improves solderability to mount the light emitting component to a circuit board. The nickel layer prevents the external terminals 15Fa to 15Fd from alloying with the solder layer. Both layers are preferably formed between 3 to 12 μm thick respectively. The above effects are insufficient if the thickness of each layer is under 3 μm, and the dimensions of the component 1A may be out of intention if the thickness of each layer is over 12 μm. Dimensional effect becomes bigger when the component 1A is downsized.

(Constant Current Circuit)

Constant current circuits preferable for the light emitting component 1A are described below.

Figure 3A:
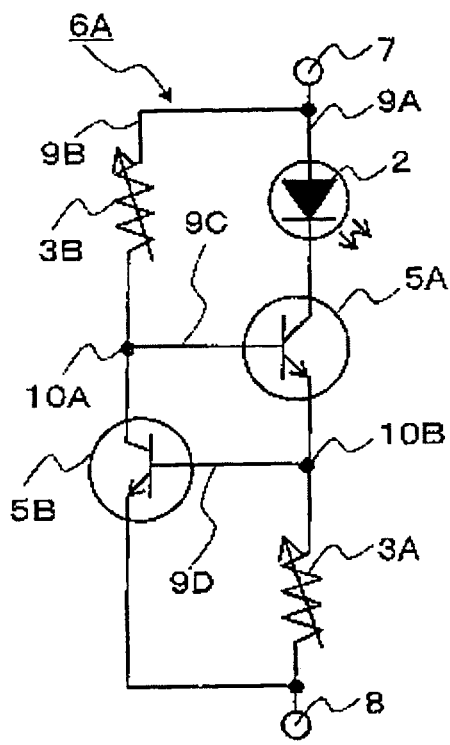

A constant current circuit 6A as shown in FIG. 3A is described below. This circuit 6A has a pair of a positive input terminal 7 and a negative input terminal 8, and two branching transmission lines 9A and 9B between the terminals. The first transmission line 9A has a LED 2, the first NPN transistor 5A and the first resistor element 3A in order of the positive input terminal 7, the first NPN transistor 5A having emitter placed closer to the negative input terminal 8 than collector. The second transmission line 9B has the second resistor element 3B and the second NPN transistor 5B in order of the positive input terminal 7, the second NPN transistor 5B having emitter placed closer to the negative input terminal 8 than collector. The third transmission line 9C connects the base terminal of the first NPN transistor 5A to the second transmission line 9B at the first junction 10A between the second resistor element 3B and the second NPN transistor 5B. Further the fourth transmission line 9D connects the base terminal of the second NPN transistor 5B to the first transmission line 9A at the second junction 10B between the first NPN transistor 5A and the first resistor element 3A.

The function of the constant current circuit 6A is described below.

When a voltage is applied between the positive input terminal 7 and the negative input terminal 8, the base terminal of the first NPN transistor 5A is electrified through the second resistor element 3B as a bias resistor to turn on the first NPN transistor 5A. Then the first NPN transistor is conductive between collector and emitter terminals to supply current to the LED 2. At this moment electric current passes from the positive input terminal 7 to the negative input terminal 8 through the first resistor element 3A, so as to electrify the base terminal of the second NPN transistor 5B. This sequence increases current passing through the first transmission line 9A, and the second NPN transistor 5B becomes conductive between collector and emitter terminals when the voltage at the base terminal of the transistor is over a specified value. The conduction of the second NPN transistor 5B maintains the voltage $V_1$ between collector and emitter terminals constant. Then the current passing through the first resistor element 3A is kept constant according to the relation "$I_1=V_1/R_1$" (where $I_1$ denotes the current passing through the resistor element and $R_1$ the resistance value of the resistor). The current $I_1$ passing through the first resistor element 3A is identical to one passing through the LED 2, and the current through the LED 2 is kept constant as high as $I_1$. Thus constant current through the LED 2 and through the first transmission line 9A reduces variation in light intensity of the LED 2.

Detailed operation of the constant current circuit 6A is described below.

When the current passing through the first resistor element 3A having the resistor value of R1 reaches a prescribed value (I=Vt/R1), the voltage of the base terminal of the second NPN transistor 5B becomes the operating voltage (Vt=0.65V) to turn on the second NPN transistor 5B. The voltage of the first NPN transistor 5A is then kept at about 1.3V. Thus the current to LED 2 is kept constant.

The connection between FIG. 3A and FIG. 2 is described here.

The locations of the positive input terminal 7, the negative input terminal 8, the first junction 10A and the second junction 10B are corresponding to the external terminals 15Fa to 15Fd of the light emitting component 1A shown in FIG. 2F respectively. The location of the positive input terminal 7 corresponds to the external terminal 15Fb, the negative input terminal 8 to the external terminal 15Fc, the first junction 10A to the external terminal 15Fa and the second junction 10B to the external terminals 15Fd. The first transmission line 9A corresponds to the circuit including the conductor 15 connecting the external terminal 15Fb (corresponding to the positive input terminal 7) with the pad 15Ca, the pad 15Ca, the gold wire 16 connecting the pads 15Ca and the anode terminal of the LED 2, the LED 2, the gold wire 16 connecting the cathode terminal of the LED 2 and the pad 15Cb, the pad 15Cb, the first NPN transistor 5A, the gold wire connecting the emitter terminal of the first NPN transistor 5A with the pad 15Cc, the pad 15Cc, the conductor 15 connecting between the pad 15Cc and the external terminal 15Fd, the external terminal 15Fd (corresponding to the second junction 10B), a mate of the paired resistor terminals 15B on the first resistor element 3A, the resistor film 18, the conductor connecting between the other mate of the paired resistor terminals 15B on the first resistor element 3A and the external terminal 15Fc, and the external terminal 15Fc (corresponding to the negative input terminal 8).

The second transmission line 9B corresponds to the circuit including the external terminal 15Fb (corresponding to the positive input terminal 7), a mate of the paired resistor terminals 15B for the second resistor element 3B, the resistor film 18, the other mate of the paired resistor terminals 15B, the conductor 15 connecting the other mate of the paired resistor terminals 15B with the external terminal 15Fa, the external terminal 15Fa, the conductor 15 connecting the external terminal 15Fa with the pad 15Cd, the pad 15Cd, the island conductor 15 equipped with the second NPN transistor 5B, the second NPN transistor 5B, the gold wire 16 connecting the emitter terminal of the second NPN transistor 5B with the pad 15Ce, the pads 15Ce, the conductor 15 connecting between the pads 15Ce and the external terminal 15Fc, and the external terminal 15Fc (corresponding to the negative input terminal 8). The first junction 10A corresponds to the external terminal 15Fa and the pad 15Cd. The third transmission line 9C corresponds to the gold wire 16 connecting the pad 15Cd and the base terminal of the first transistor 5A. The second junction 10B corresponds to the external terminal 15Fd, the pad 15Cc, the conductor connecting the pad 15Cc and the pad 15Cf, and the pad 15Cf. The fourth transmission line 9D corresponds to the fold wire connecting between the pad 15Cf and the base terminal of the second NPN transistor 5B.

In addition to the light emitting component 1A with the constant current circuit 6A, for example, another light emitting component 1B (see FIGS. 4 and 5) with the constant current circuit 6B, a different light emitting component 1C (see FIGS. 6 and 7) with the constant current circuit 6C, and further different light emitting component 1D (see FIGS. 8 and 9) with the constant current circuit 6D are available for embodiments of the invention.

Figure 3B:
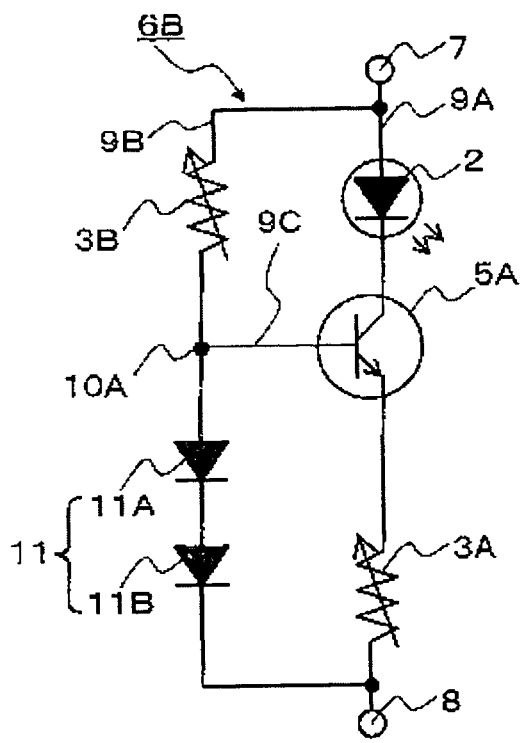

The construction of the constant current circuit 6B as shown in FIG. 3B is described below. In the figure, same signs are applied to the elements each of which is identical to or has the same function as for one used in the circuit 6A.

The circuit 6B has a pair of a positive input terminal 7 and a negative input terminal 8, and two branching transmission lines 9A and 9B between the terminals. The first transmission line 9A has a LED 2, a NPN transistor 5A corresponding to the first NPN transistor 5A, and the first resistor element 3A in order of the positive input terminal 7, the NPN transistor 5A having emitter placed closer to the negative input terminal 8 than collector. The second transmission line 9B has the second resistor element 3B and two diodes 11A and 11B in order of the positive input terminal 7, the diodes laid in series in order of anode and cathode along with the order of the positive and the negative terminals. The third transmission line 9C connects the first junction 10A between the second resistor element 3B and the diodes 11 with the base terminal of the NPN transistor 5A.

The function of the constant current circuit 6B is described below.

When a voltage is applied between the positive input terminal 7 and the negative input terminal 8, the base terminal of the NPN transistor 5A is electrified through the second resistor element 3B as a bias resistor to turn on the NPN transistor 5A. Then the NPN transistor 5A becomes conductive between collector and emitter terminals to supply current to the LED 2. At this moment electric current passes from the positive input terminal 7 to the negative input terminal 8 through the first resistor element 3A, and the current also passes through the diodes 11. This forward current produces voltage drop within each diode due to its internal resistance. Then the internal resistance of each diode reduces quickly so that electric current increases in the second transmission line 9B. Voltage drop on each diode is almost constant as high as 0.5-1V, resultant voltage drop of the two diodes 11A and 11B being about 1-2V. This value is equal to the voltage drop between base and emitter terminals of the first NPN transistor 5A added with the voltage drop at the first resistor element 3A. Then the current $I_2$ passing through the first resistor element 3A is kept constant according to the relation "$I_2=V_2/R_1$" (where $V_2$ denotes the voltage at the first junction 10A and $R_1$ the resistance value of the first resistor 3A). The current $I_2$ passing through the first resistor element 3A is identical to one passing through the LED 2, and the current through the LED 2 is kept constant as high as $I_2$. Thus constant current through the LED 2 and through the transmission line 9B reduces variation in light intensity of the LED 2.

The reason why two diodes 11A and 11b are used in series is to adjust voltage drop of the diodes 11. Number of diodes is increased according to voltage drop to be required.

Detailed operation of the constant current circuit 6B is described below.

When a voltage is applied to the circuit through the positive input terminal 7, the total of the forward voltage on the diodes 11A and 11B with identical performance (Vf=0.54V for each diode in this circuit) is applied to the base terminal of the NPN transistor 5A (Vf×2=1.08V) to turn on the NPN transistor 5A. The emitter voltage (VE) of the NPN transistor 5A is then the value as high as (Vf×2−Vbe), where Vbe is the voltage between base and emitter terminals of the NPN transistor 5A as high as 0.65V. If the resistance of the first resistor element 3A is 21.5Ω, the current passing through the first transmission line 9A (I2) determined as 20 mA with the formula "VE/$R_1$= (0.54×2−0.65)/21.5." This current is constant.

Figure 4A:
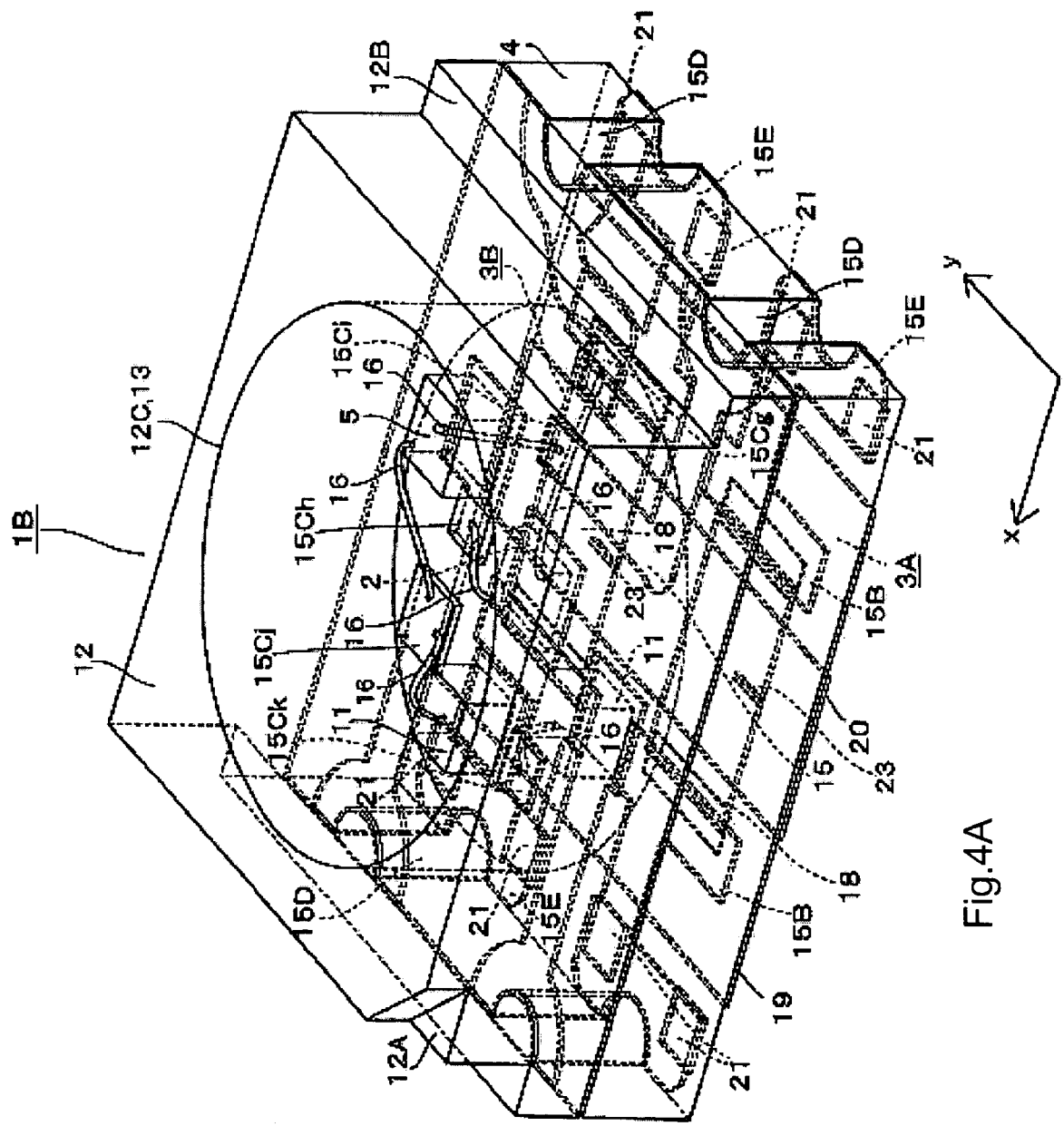
FIG. 4 A shows a perspective view of another light emitting component according to the invention.

The connection of the construction of a light emitting component 1B shown in FIGS. 4 and 5 with the constant current circuit 6B shown in FIG. 3B is described here. The locations of the positive input terminal 7, the negative input terminal 8, and the first junction 10A are corresponding to the external terminals 15Fe to 15Fg shown in the bottom view of the light emitting component 1B in FIG. 5F respectively. The positive input terminal 7 corresponds to the external terminal 15Ff, the negative input terminal 8 to the external terminal 15Fg, and the first junction 10A to the external terminal 15Fe. The first transmission line 9A corresponds to the circuit including the conductor 15 connecting the external terminal 15Ff (corresponding to the positive input terminal 7) with the pad 15Cg, the pad 15Cg, the gold wire 16 connecting the pad 15Cg and the anode terminal of the LED 2, the LED 2, the gold wire 16 connecting the cathode terminal of the LED 2 and the pad 15Ch, the pad 15Ch, the island conductor 15 connected to the pad 15Ch, the first NPN transistor 5A, the gold wire 16 connecting the emitter terminal of the first transistor 5A with the pad 15Ci, the pad 15Ci, the conductor 15 connecting between the pad 15Ci and the external terminal 15Fh, a mate of the paired resistor terminals 15B for the first resistor element 3A, the resistor film 18, the conductor 15 connecting between the other mate of the paired resistor terminals 15B for the first resistor element 3A and the external terminal 15Fg, and the external terminal 15Fg (corresponding to the negative input terminal 8).

The second transmission line 9B corresponds to the circuit including a mate of the paired resistor terminals 15B for the second resistor element 3B, the resistor film 18, the other mate of the paired resistor terminals 15B, the conductor 15 connecting the other mate of the paired resistor terminals 15B with the external terminal 15Fe, the external terminal 15Fe, the conductor 15 connecting the external terminal 15Fe with the pad 15Cj, the pad 15Cj, the gold wire 16 connecting the pad 15Cj with the anode terminal of the first diode 11A, the first diode 11A, the island conductor 15 connected to the cathode terminal of the first diode 11A, the pad 15Ck connected to the island conductor 15, the gold wire 16 connecting the pad 15Ck with the anode terminal of the second diode 11B, the second diode 11B, the gold wire 16 connected to the cathode terminal of the second diode 11B, the conductor 15 connecting between the island conductor 15 and the external terminal 15Fg, and the external terminal 15Fg (corresponding to the negative input terminal 8). The first junction 10A corresponds to the external terminal 15Fe and the pad 15Cj. The third transmission line 9C corresponds to the gold wire 16 connecting the pad 15Cj and the base terminal of the first transistor 5A, and the island conductor 15.

Figure 3C:
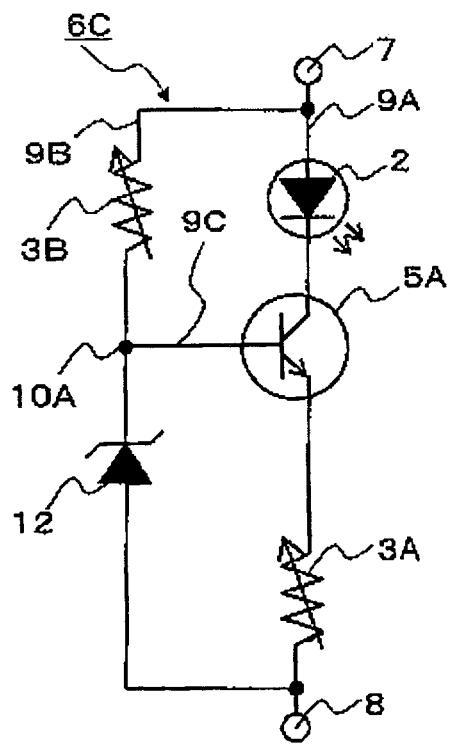

The construction of the constant current circuit 6C as shown in FIG. 3C is described below. In the figure, same signs are applied to the elements each of which is identical to or has the same function as for one used in the circuit 6A.

The circuit 6C has a pair of a positive input terminal 7 and a negative input terminal 8, and two branching transmission lines 9A and 9B between the terminals. The first transmission line 9A has a LED 2, a NPN transistor 5A, and the first resistor element 3A in order of the positive input terminal 7, the NPN transistor 5A having emitter placed closer to the negative input terminal 8 than collector. The second transmission line 9B has the second resistor element 3B and a Zener diode 11C in order of the positive input terminal 7, the diode laid in order of anode and cathode along with the order of the positive and the negative terminals. The third transmission line 9C connects the first junction 10A between the second resistor element 3B in the second transmission line 9B and the Zener diode 11C with the base terminal of the NPN transistor 5A.

The function of the constant current circuit 6B is described below.

When a voltage is applied between the positive input terminal 7 and the negative input terminal 8, the base terminal of the NPN transistor 5A is electrified through the second resistor element 3B as a bias resistor to turn on the NPN transistor 5A. Then the NPN transistor 5A becomes conductive between collector and emitter terminals to supply current to the LED 2. At this moment electric current passes from the positive input terminal 7 to the negative input terminal 8 through the first resistor element 3A, and the current also passes through the Zener diode 11C. This reverse current to the Zener diode quickly reduces the resistance of the diode so that electric current increases in the second transmission line 9B. Voltage drop on the Zener diode is equal to the voltage drop between base and emitter terminals of the NPN transistor 5A added with the voltage drop at the first resistor element 3A. Then the current $I_3$ passing through the first resistor element 3A is kept constant according to the relation "$I_3=V_3/R_1$" (where $V_3$ denotes the voltage at the first junction 10A and $R_1$ the resistance value of the first resistor 3A). The current $I_3$ passing through the first resistor element 3A is identical to one passing through the LED 2, and the current through the LED 2 is kept constant as high as $I_3$. Thus constant current through the LED 2 reduces variation in light intensity of the LED 2.

Detailed operation of the constant current circuit 6C is described below.

When a voltage is applied between the positive input terminal 7 and the negative input terminal 8, the Zener voltage (Vz=2.0V) of the Zener diode 11C is applied to the base of the NPN transistor 5A to set the base voltage (VB) to Vz, resulting in turning on the NPN transistor 5A. The emitter voltage (VE) of the NPN transistor 5A then becomes the value as high as (Vz–Vbe), where Vbe is the voltage between base and emitter terminals of the NPN transistor 5A as high as 0.65V. If the resistance of the first resistor element 3A ($R_1$) is 67.5Ω, the current passing through the transmission line 9A (IE) determined as 20 mA with the formula "VE/R1=(2.0–0.65)/67.5." This current is constant.

Each of the constant current circuits 6A, 6B and 6C shown in FIGS. 3A, 3B and 3C respectively, has two resistor elements 3 for each of which resistance value is trimmed. This trimming makes each of the circuits 6A, 6B and 6C with a plurality of resistor elements stable.

Figure 6:
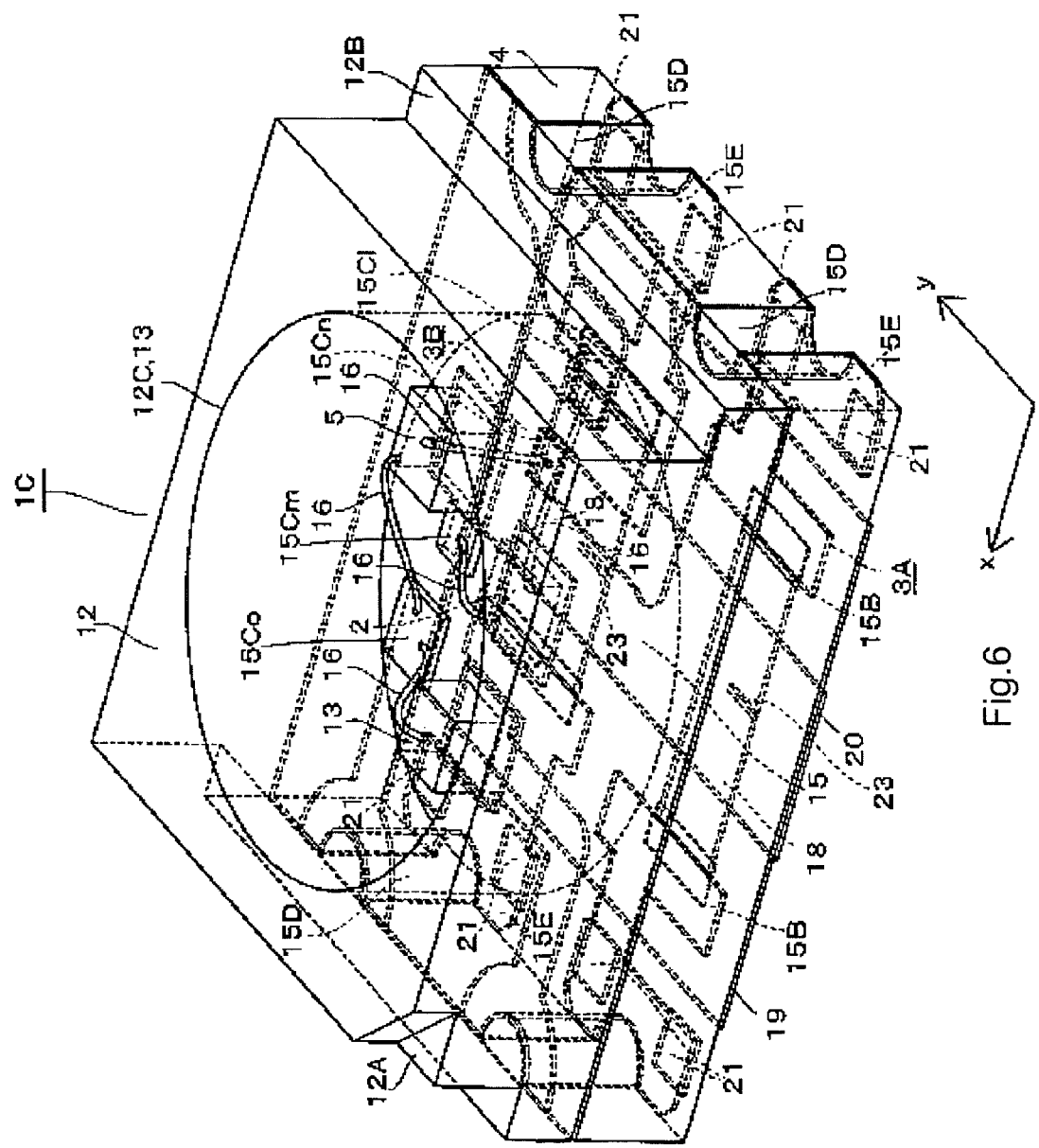
FIG. 6 shows a perspective view of further different component according to the invention.
Figure 7:
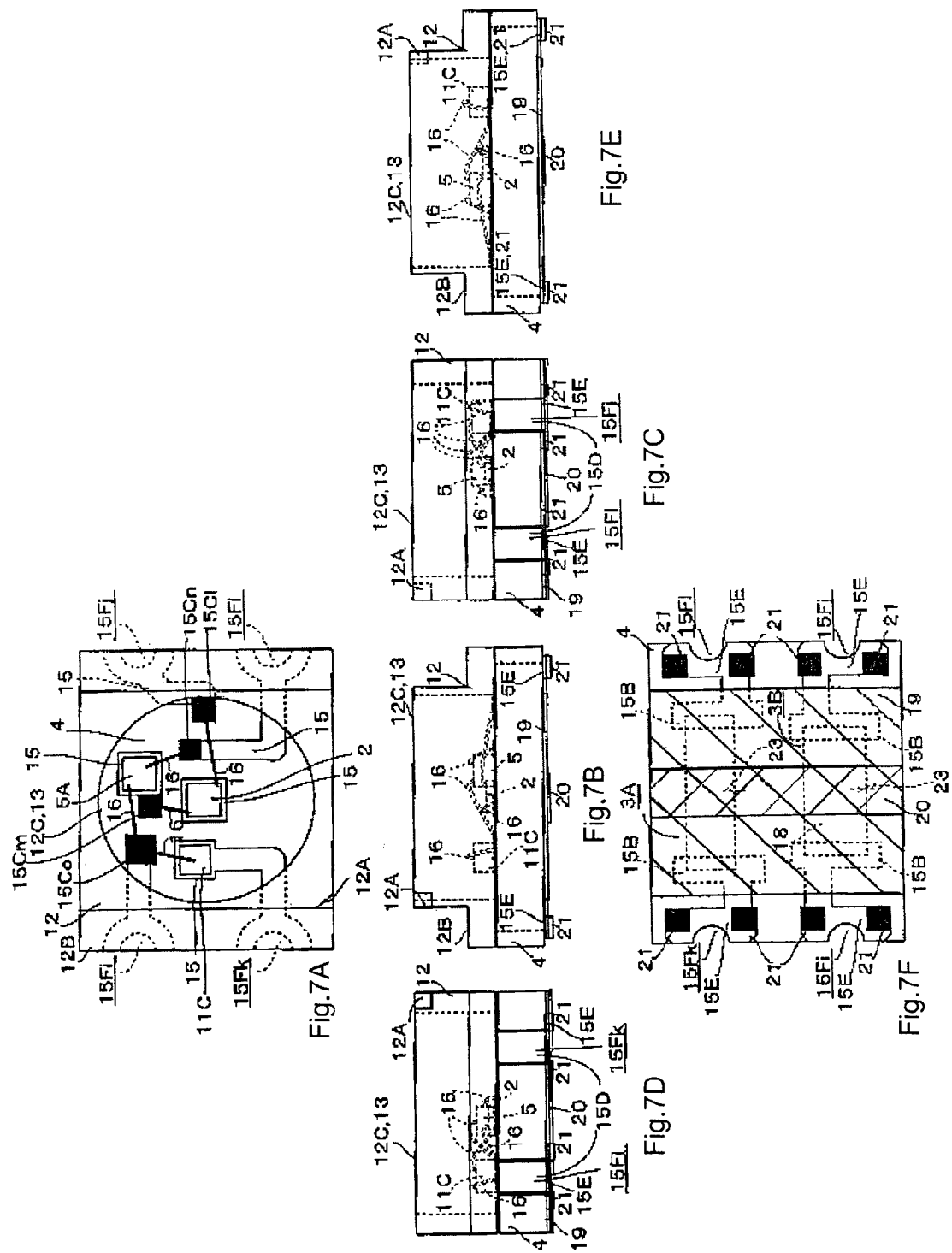
FIG. 7 shows six projection views of the component shown in FIG. 4, wherein FIG. 7 A is plan view, FIG. 7 B front view, FIG. 7 C right side view, FIG. 7 D left side view, FIG. 7 E back view and FIG. 7 F bottom view respectively.

The connection of the construction of a light emitting component 1C shown in FIGS. 6 and 7 with the constant current circuit 6C shown in FIG. 3C is described here. The locations of the positive input terminal 7, the negative input terminal 8, and the first junction 10A are corresponding to the external terminals 15Fi to 15Fk shown in the bottom view of the light emitting component 1C in FIG. 7F respectively. The positive input terminal 7 corresponds to the external terminal 15Fj, the negative input terminal 8 to the external terminal 15Fk, and the first junction 10A to the external terminal 15Fi. The first transmission line 9A corresponds to the circuit including the conductor 15 connecting the external terminal 15Fj (corresponding to the positive input terminal 7) with the pad 15Cl, the pad 15Cl, the gold wire 16 connecting the pad 15Cl and the anode terminal of the LED 2, the LED 2, the gold wire 16 connecting the cathode terminal of the LED 2 and the pad 15Cm, the pad 15Cm, the island conductor 15 connected to the pad 15Cm, the gold wire 16 connecting the emitter terminal of the NPN transistor 5A with the pad 15Cn, the pad 15Cn, the conductor 15 connecting between the pad 15Cn and, the external terminal 15Fl, a mate of the paired resistor terminals 15B for the first resistor element 3A, the resistor film 18, the conductor 15 connecting between the other mate of the paired resistor terminals 15B for the first resistor element 3A and the external terminal 15Fk, and the external terminal 15Fk (corresponding to the negative input terminal 8).

The second transmission line 9B corresponds to the circuit including a mate of the paired resistor terminals 15B for the second resistor element 3B, the resistor film 18, the other mate of the paired resistor terminals 15B, the conductor 15 connecting the other mate of the paired resistor terminals 15B with the external terminal 15Fi, the external terminal 15Fi, the conductor 15 connecting the external terminal 15Fi with the pad 15Co, the pad 15Co, the gold wire 16 connecting the pad 15Co with the cathode terminal of the Zener diode 11C, the island conductor 15 connected to the anode terminal of the diode 11C, the conductor 15 connecting between the island conductor 15 and the external terminal 15Fk, and the external terminal 15Fk (corresponding to the negative input terminal 8). The first junction 10A corresponds to the pad 15Co. The third transmission line 9C corresponds to the gold wire 16 connecting the pad 15Co and the base terminal of the first transistor 5A, and the island conductor 15.

Each of the above circuit examples has two resistor elements, but some other circuits are available for the aimed constant current circuit. An example is the constant current circuit 6D shown in FIG. 3D. The construction of this circuit is described below. The circuit 6D has a pair of a positive input terminal 7 and a negative input terminal 8, putting a LED 2 and a n-channel field effect transistor 5C between the terminals. Gate and drain of the transistor 5C is connected through a resistor element 3C.

The function of the circuit 6D is described below.

The constant current circuit 6D uses a n-channel Junction Field-Effect Transistor (JFET) 5C, which utilizes the voltage between gate and source (VGS) to control the current passing between drain and source (drain current). The drain current is at the maximum (IDSS) when VGS is 0V, that is it is impossible to pass a current over IDSS where gate and source are short-circuited. The current doesn't reduce under IDSS where the voltage is enough. This performance is used in the constant current circuit 6D to reduce variation in light intensity of the LED 2. The third resistor element 3C is equipped with a trimming channel 23 to adjust IDSS or light intensity of the LED 2.

In the constant current circuit 6D, the third resistor element 3C is trimmed to adjust its resistance value R3 so as to control IDSS, according to the formula "IDSS=VGS/R3."

Figure 3D:
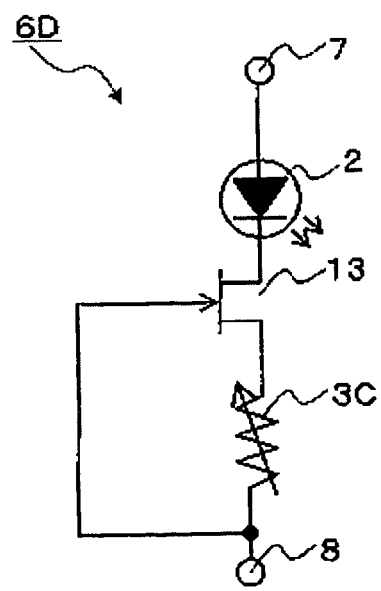
Figure 8:
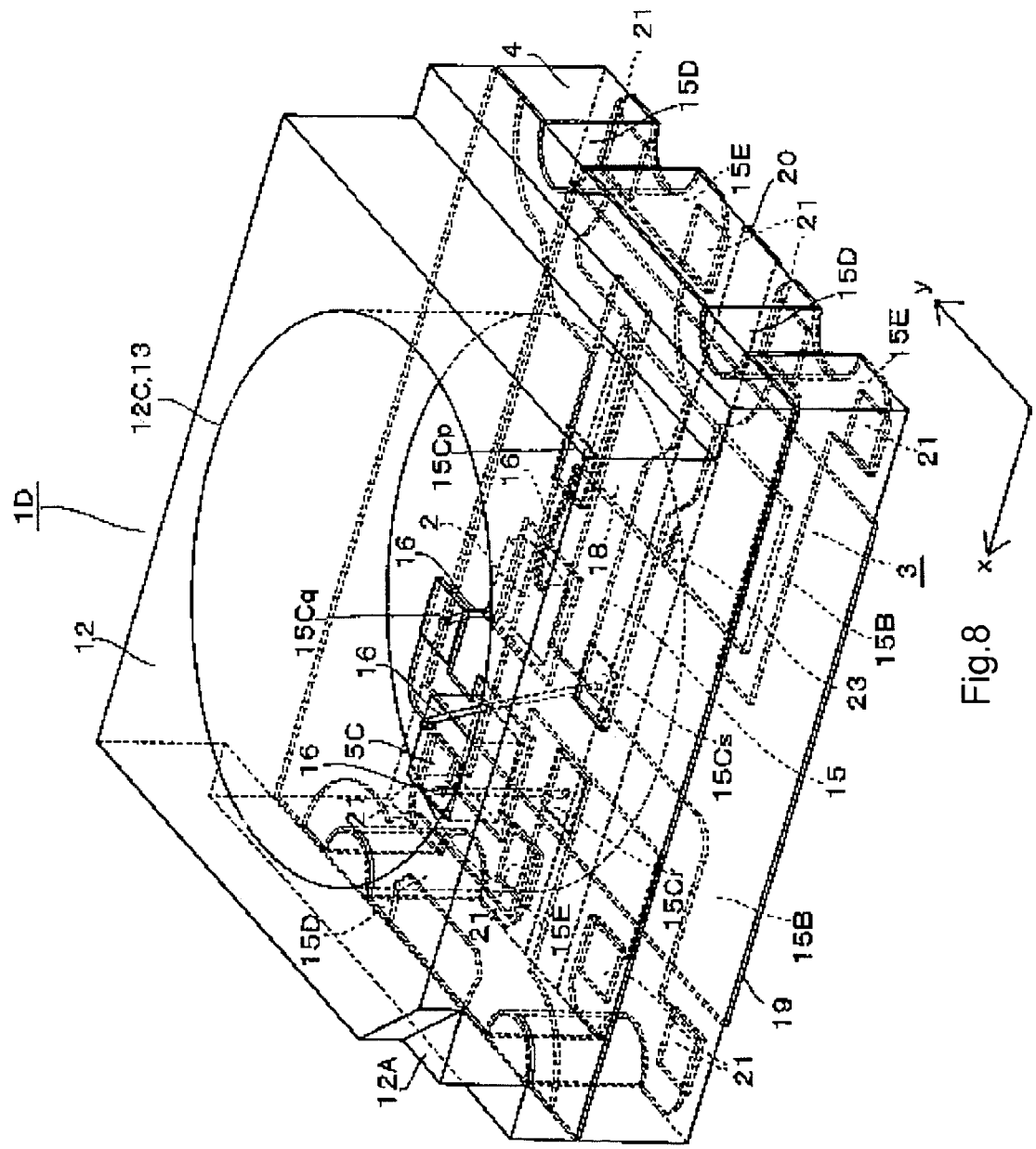
FIG. 8 shows a perspective view of another light emitting component according to the invention.

The connection of the construction of a light emitting component 1D shown in FIGS. 8 and 9 with the constant current circuit 6D shown in FIG. 3D is described here. The locations of the positive input terminal 7, and the negative input terminal 8 are corresponding to the external terminals 15Fn to 15Fo shown in the bottom view of the light emitting component 1D in FIG. 9F respectively.

The positive input terminal 7 corresponds to the external terminal 15Fn, the negative input terminal 8 to the external terminal 15Fo or 15Fm, both of the terminals 15Fo and 15Fm connected by the conductor 15 on the surface of the substrate 4 (see FIG. 9A). The transmission line from the positive input terminal 7 to the anode terminal of the LED 2 corresponds to the circuit including the conductor 15 connecting the external terminal 15Fn (corresponding to the positive input terminal 7)

with the pad 15Cp, the pad 15Cp, and the gold wire 16 connecting the pad 15Cp and the anode terminal of the LED 2.

The transmission line from the cathode terminal of the LED 2 to the drain terminal of the field effect transistor 5C includes the gold wire connecting the cathode terminal of the LED 2 and pad 15Cq, the pad 15Cq, and the island conductor 15 connecting the pad 15Cq and the drain terminal of the transistor 5C. The transmission line from the source terminal of the field effect transistor 5C to the third resistor element 3C includes the gold wire connecting the source terminal of the transistor 5C and pad 15Cs, the pad 15Cs, conductor 15 connecting the pad 15Cs and external terminal 15Fp, the external terminal 15Fp, conductor 15 connecting the external terminal 15Fp and resistor terminal 15B, and the resistor terminal 15B. The transmission line from the third resistor element 3C to the gate terminal of the transistor 5C includes conductor 15 connecting external terminal 15Fo (corresponding to the negative input terminal 8) and the resistor terminal 15B, the resistor terminal 15B, conductor 15 connecting the external terminal 15Fo and pad 15Cr, the pad 15Cr, and gold wire 16 connecting the pad 15Cr and the gate terminal of the transistor 5C.

A plurality of resistor elements in series is also available instead of the third resistor element 3C in the circuit 6D. One or more resistor elements of them are preferably trimmed their resistance values, so as to distribute damage of resistor element on trimming. In the circuit 6D, if trimming should damage resistor element, the damage is concentrated into the resistor element 3C.

The constant current circuit 6A is effective to realize low part costs, the circuit 6B is effective to reduce temperature change after electrification, the circuit 6C is more effective to reduce temperature change after electrification, and the circuit 6D is effective to reduce the costs for production of the third resistor element 3C and wire bonding to be described later as well as realize low part costs because of use of the only one resistor element.

FIG. 4 shows the perspective view of the light emitting component 1B with the constant current circuit 6B, and FIG. 5 shows 6 projection views of the component 1B. FIG. 6 shows the perspective view of the light emitting component 1C with the constant current circuit 6C, and FIG. 7 shows 6 projection views of the component 1C. FIG. 8 shows the perspective view of the light emitting component 1D with the constant current circuit 6D, and FIG. 9 shows 6 projection views of the component 1D. For respective 6 projection views, FIG. 9 A is plan view, FIG. 9 B is front view, FIG. 9 C is right side view, FIG. 9 D is left side view, FIG. 9 E is back view and FIG. 9 F is bottom view.

Manufacturing methods for the light emitting components 1A, 1B, 1C and 1D according to the invention are described below referring to figures. However detailed method is described only for the component 1A, and differences are only added for other components 1B, 1C and 1D.
(A Manufacturing Method of the Light Emitting Component 1A)

To manufacture the light emitting component 1A according to the invention, a mother insulating substrate with borders 4C is prepared, the substrate 4C having a plurality of unit substrates 4A partitioned with crosswise border lines 4B, each of the unit substrates 4A having the ratio of x/y between 1 and 1.5, x being the length of one pair of opposite sides of the unit substrate and y being the length of the other pair of opposite sides of the unit substrate. A manufacturing method of the component 1A comprises resistor forming process to place an in-process resistor elements 3' with unadjusted resistance value on the back side of each unit substrate; assembly process of a LED 2 and transistors 5 on the surface of each unit substrate 4A; conductor forming process to form conductors 15 connecting the in-process resistor elements 3', the LED 2, and the transistors 5 respectively so as to constitute a constant current circuit on each unit substrate; trimming process to trim resistance value of each in-process resistor element 3' on each unit substrate 4A after the above assembly and conductor forming steps in order to adjust light intensity of the LED 2 on each unit substrate 4A within the specified range; and dividing process to divide the said mother insulating substrate with borders 4C into individual unit substrates 4A along with the border lines 4B.

In the above manufacturing method, it is preferable to add bonding process to bond a mother hollow member 12D with a plurality of penetrating holes 12C on the surface of the mother insulating substrate with borders 4C before the assembly step, opening of each penetrating hole 12C to be faced against the surface of each unit substrate 4A; and to add to the dividing step division of the hollow member 12D into individual unit hollow members 12C together with individual unit substrates 4A.

The above manufacturing method of the component 1A is broken down into individual steps for detailed description.

FIGS. 10 and 11 show steps of the above manufacturing method of the light emitting component 1A. Each of FIGS. 10 B, C, D, E, F, G and (H) and FIGS. 11 A, B, C, D, E and F should be illustrated for the whole mother substrate 4C, but they are illustrated for a unit substrate 4A (corresponding to the said substrate 4) for convenience. FIG. 10 is the illustration for the back surface of the mother insulating substrate with borders 4C (the substrate 4), and FIG. 11 for the surface of the mother insulating substrate with borders 4C (the substrate 4).
(Resistor Forming Process)

A mother insulating substrate with borders 4C made of alumina ceramics and having border lines, as shown in FIG. 10A, is prepared. This substrate 4C has crosswise border lines 4B (dividing channels) and through-holes 22. The resistor forming step is made for the mother substrate 4C.

Then conductors 15 are formed on the mother substrate 4C. FIG. 10C and FIG. 11B show the formed conductors 15 on the back surface (FIG. 10C) and on the surface (FIG. 11 B) of the substrate 4. Some parts of the conductors 15 serve as the resistor terminals 15B for each resistor element 3 to be placed later. Other parts of the conductors 15 constitute parts of the transmission lines 9A, 9B, 9C and 9D shown in FIG. 3, sites for the bumps 21, the resistor terminals 15B, the side terminals 15D and the back terminals 15E. The island conductor 15 formed on the surface of the substrate 4 serves the mark for placing the LED 2 as well.

A method to form the conductors 15 is described below.

A metal glaze paste (ink) layer including silver-palladium alloy powder is formed with through-hole printing method on the back surface of the mother insulating substrate with borders 4C with border lines, and the substrate is fired to form the conductors 15 (FIG. 10C). The metal glaze layer is also formed on the surface of the substrate with the same method and fired (FIG. 11B). The through-hole printing method is a screen printing with vacuuming on the surface opposite to the printing surface through through-holes 22. This method applies the metal glaze ink to all or part of wall for each through-hole 22 on the substrate 4C, then the conductors 15 on both side of the substrate 4C are respectively connected with each through-hole 22 with conductive wall.

On the back surface of the substrate 4C, bumps 21 are formed as shown in FIG. 10D, so as to provide external terminals 15Fa to 15Fd each of which will be taller than resistor film 18 to be formed on the surface later. The bumps 21 are formed separately on the locations where the external terminals 15Fa to 15Fd (to be the terminals on surface mounting of the substrate) are prepared on the substrate 4. These bumps 21 can be formed after the formation of resistor film 18, glass film 19 or overcoat 20, or after trimming step, as well as at the time of conductor 15 formation.

The distance between paired resistor terminals 15B for resistor element 3A is different from one for resistor element 3B. It is because the resistance values should be much different between the elements 3A and 3B, and use of different types of resistor paste described later is insufficient to obtain desired resistance values. However equal distance is also available for both elements.

As the next step, pads 15Ca, 15Cb, 15Cc, 15Cd, 15Ce and 15Cf are formed on the surface of the substrate 4C with screen printing of gold paste. For the pads 15Ca, 15Cc, 15Ce and 15Cf, the gold paste is printed on the top of each conductor 15 connecting the surface with the back surface. For the pad 15Cb, the gold paste is printed to contact island conductor 15 to be placed with the first NPN transistor 5A later, and for the pad 15Cd, to contact island conductor 15 to be placed with the second NPN transistor 5B later. The substrate 4C is then fired to fix each of the pads 15Ca to 15Cf (see FIG. 1C). These pads respectively ensure the connection of each conductor 15 with each gold wire 16 as bonding wire.

Resistor films 18 are then formed on the back surface of the substrate 4C. A metal glaze paste (ink) including a mixed powder of ruthenium oxide and another metal element is printed on the back surface to contact both of the paired resistor terminals 15B, and fired (see FIG. 10E). This step forms in-process resistor elements 3' with the resistor film 18 contacting both of the paired resistor terminals 15B. For the resistor films 18, another ink is further printed on the same positions of the existing films, so as to make the resistance values of the two resistor elements 3' different.

Glass film 19 is then formed. A glass paste (ink) is printed with screen printing method on the back surface of the substrate (the mother substrate 4C) to cover the surface including the resistor films 18 but excluding back terminal 15E, side terminal 15D and the bumps 21, and fired (see FIG. 10F). The glass film 19 covers the overlapped parts of each resistor film 18 with each resistor terminal 15B, so that these parts become most thickest on the resistor elements 3'. However this glass film 19 is aimed to protect the resistor films 18 at each part not trimmed on formation of trimming channels 23. Then it is also possible to form the glass film 19 only on the expected area to be formed with the trimming channels 23.

(Assembly Process)

A LED 2 and two transistors 5 as high as or taller than the LED 2 are placed on the surface of mother insulating substrate with borders 4C, the LED 2 to be placed on the island conductor 15 in the center of the substrate 4 (unit substrate 4A) and the first and the second transistors 5A, 5B on respective island conductor 15 around the LED 2. A chip mounting machine is used to this procedure. A thermosetting conductive resin adhesive (die bonding paste) is used to bond the LED 2 and two transistors 5. To apply this adhesive, a needle applied with the adhesive is carried to the aimed point of island conductor 15. A syringe like an injector is also available for the work. This process electrically connects collector terminal on the bottom of each transistor 5 with each island conductor 15.

The above resistor forming process and assembly process are applicable to the light emitting component 1B shown in FIGS. 4 and 5, the light emitting component 1C shown in FIGS. 6 and 7, and the light emitting component 1D shown in FIGS. 8 and 9 as well. The patterns of the conductors 15, the pads 15Cg, 15Ch, 15Ci, 15Cj, 15Ck, 15Cl, 15Cm, 15Cn, 15Co, 15Cp, 15Cq, 15Cr and 15Cs, and the resistor films 18 for the above components are respectively shown in FIG. 5, FIG. 7 and FIG. 9. For the light emitting component 1B, LED 2, two diodes and the transistor 5A are all placed on the surface of the substrate 4. For the light emitting component lC, LED 2, the Zener diode 11C and the transistor 5A are all placed on the surface of the substrate 4. For the light emitting component 1D, LED 2 and a field effect transistor 5C are placed on the surface of the substrate 4.

(Conductor Forming Process)

In this conductor forming process, 6 gold wires 16 are placed with wire bonding method to connect the conductors 15 prepared in the said resistor forming process and the said assembly process, the in-process resistor elements 3', the LED 2 and the transistors 5 so as to constitute the constant current circuit shown in FIG. 3A (see FIG. 11E).

The above conductor forming process is applicable to the light emitting component 1B shown in FIGS. 4 and 5, the light emitting component 1C shown in FIGS. 6 and 7, and the light emitting component 1D shown in FIGS. 8 and 9 as well. To constitute the constant current circuit 6B shown in FIG. 3B, LED 2 and two diodes (11A, 11B) are placed on the bottom of cavity 13 in the assembly process, and gold wires 16 are placed with wire bonding method in the conductor forming process. To constitute the constant current circuit 6C shown in FIG. 3C, LED 2 and Zener diode 11C are placed on the bottom of cavity 13 in the assembly process, and gold wires 16 are placed with wire bonding method in the conductor forming process. To constitute the constant current circuit 6D shown in FIG. 3D, an in-process resistor element 3' is formed in the resistor forming process, LED 2 and a field effect transistor 5C are placed on the bottom of cavity 13 in the assembly process, and gold wires 16 are placed with wire bonding method in the conductor forming process.

The conductor forming process to constitute the constant current circuit 6A for the light emitting component 1A, with gold wires 16, is described below referring to FIG. 2A. Anode terminal of LED 2 is connected with the pad 15Ca, so as to connect the terminal with external terminal 15Fb corresponding to the positive input terminal 7. Cathode terminal of the LED 2 is connected with pad 15Cb, so as to connect the terminal with collector terminal of the first NPN transistor 5A. Emitter terminal of the first NPN transistor 5A is then connected with pad 15Cc, so as to connect the terminal with the in-process resistor element 3' (the first resistor element 3A before trimming). Base terminal of the first NPN transistor 5A is connected with pad 15Cd, so as to connect the terminal with the in-process resistor element 3' (the first resistor element 3B before trimming). Emitter terminal of the second NPN transistor 5B is then connected with pad 15Ce, so as to connect the terminal with external terminal 15Fc corresponding to the negative input terminal 8. Base terminal of the second NPN transistor 5B is connected with pad 15Cf, so as to connect the terminal with the first resistor element 3A.

The conductor forming process to constitute the constant current circuit 6B for the light emitting component 1B, with gold wires 16, is described below referring to FIG. 5A. Anode terminal of LED 2 is connected with the pad 15Cg, so as to connect the terminal with external terminal 15Ff corresponding to the positive input terminal 7. Cathode terminal of the LED 2 is connected with pad 15Ch, so as to connect the terminal with collector terminal of a NPN transistor 5A. Emitter terminal of the NPN transistor 5A is then connected with pad 15Ci, so as to connect the terminal with the in-process resistor element 3' (the first resistor element 3A before trimming). Anode terminal of the diode 11A is connected with pad 15Cj, so as to connect the terminal with the in-process resistor element 3'. Base terminal of the NPN transistor 5A is connected with pad 15Cj, so as to connect the terminal with the in-process resistor element 3' (the second resistor element 3B). Anode terminal of the diode 11B is then connected with pad 15Ck, so as to connect anode terminal of the diode 11B with cathode terminal of the diode 11A.

The conductor forming process to constitute the constant current circuit 6C for the light emitting component 1C, with gold wires 16, is described below referring to FIG. 7A. Anode terminal of LED 2 is connected with pad 15Cl, so as to connect the terminal with external terminal 15Fj corresponding to the positive input terminal 7. Cathode terminal of the LED 2 is connected with pad 15Cm, so as to connect the terminal with collector terminal of a NPN transistor 5A. Emitter terminal of the NPN transistor 5A is then connected pad 15Cn, so as to connect the terminal with the in-process resistor element 3' corresponding to the first resistor element 3A. Cathode terminal of Zener diode 11C is connected with pad 15Co, so as to connect the terminal with the in-process resistor element 3' corresponding to the second resistor element 3B. Base terminal of the NPN transistor 5A is connected with the pad 15Co, so as to connect the terminal with the in-process resistor element 3' (the second resistor element 3B).

The conductor forming process to constitute the constant current circuit 6D for the light emitting component 1D, with gold wires 16, is described below referring to FIG. 9A. Anode terminal of LED 2 is connected with pad 15Cp, so as to connect the terminal with external terminal 15Fn corresponding to the positive input terminal 7. Cathode terminal of the LED 2 is connected with pad 15Cq, so as to connect the terminal with drain terminal of field effect transistor 5C. Gate terminal of the transistor 5C is then connected to pad 15Cr and source terminal to pad 15Cs respectively, so as to short-circuit the gate and the source terminals through in-process resistor element 3' corresponding to the third resistor element 3C.

(Bonding Process)

The bonding process is described below. FIG. 11F shows the plan view of the substrate 4 after bonding process is completed. FIG. 11G shows the plan view of the mother hollow member 12D to be used in the bonding process. The mother hollow member 12D is separated into pieces to provide individual unit substrates. The mother hollow member 12D is made of a liquid crystal molding and has a plurality of dividing lines 12E crosswise on the back surface, the intervals between the dividing lines equal to those for the border lines 4B on the mother insulating substrate with borders 4C. The hollow member 12D also has channels 12B (corresponding to thin part 12 on the unit hollow member 12) on the surface. The hollow member 12D further has a cathode mark 12A shown in FIGS. 1 and 2, for each unit hollow member 12.

In this bonding process, the surface of the mother insulating substrate with borders 4C (having the LED 2) finished with the assembly process is bonded with the back surface of the mother hollow member 12D (having the dividing lines 12E) using a thermosetting (epoxy) adhesive. In the bonding, the mother hollow member 12D is so that each of the penetrating holes 12C encloses a LED 2 and two transistors 5, and that the dividing lines 12E align with the border lines 4B on the mother substrate 4C. Then a plurality of cavities 13 are formed with the penetrating holes 12C and the surface of the mother insulating substrate with borders 4C.

The bonding process is also available just after the in-process resistor elements 3' are formed or after trimming process. The bonding process to be conducted after both of assembly and connection processes are completed, realizes good workability by avoiding placement and wire-bonding of the LED 2 and the transistors 5 on the surface formed with the penetrating hole 12C. If the bonding process is conducted after the trimming process to be described later, variation in light intensity between LEDs may be bigger.

(Sealing Process)

Sealing process is next described below. A light-permeable resin (not illustrated) is supplied only in each cavity 13 to seal gold wires 16, LED 2 and transistors 5A and 5B. A silicone adhesive is available for the resin. A screen printing method is used to supply the resin. The mother insulating substrate with borders 4C is then heated to cure the resin. The resin doesn't exist around the area along with the border lines 4B, since the resin is supplied only in each cavity 13, thereby dividing the mother substrate into individual unit substrates is facilitated. As described before, the resin can be supplied over the cavities 13, or swollen or recessed on the opening of each cavity 13.

(Trimming Process)

Trimming process is described below. In this process, each of the two in-process resistor elements 3' is trimmed with resistance value into a target value. First, one of the two resistor elements 3' (to be the second resistor element 3B shown in FIG. 3A) is contacted with trimming probe at both terminals (external terminals 15Fa and 15Fb in FIG. 2A) and laser beams are locally irradiated to evaporate both of resistor film 18 and glass film 19 monitoring resistance value of the resistor element 3', so as to form a trimming channel 23 (FIG. 10G). This trimming channel 23 narrows current path on the resistor element 3'.

This trimming also adjusts bias current to the first NPN transistor 5A shown in FIG. 3A, this adjustment creating current passing through the first transmission line 9A to illuminate the light emitting component 1A. Through this trimming, the in-process resistor element 3' is made into the second resistor element 3B. The glass film 19 serves to suppress excessive destruction of the resistor film 18 on formation of the trimming channel 23. In the same way, the in-process resistor element 3' in each of the light emitting components 1B and 1C is trimmed to form the second resistor element 3B. The external terminals to contact the trimming probe are the external terminals 15Fe and 15Ff in FIG. 5A for the component 1B, and the external terminals 15Fi and 15Fj in FIG. 7A for the component 1C respectively.

Then the other in-process resistor element 3' (to be the first resistor element 3A shown in FIG. 3A) is trimmed. First, trimming probe is contacted with both ends of the element 3' (external terminals 15Fc and 15Fd in FIG. 2A) and a current is applied between the positive input terminal 7 and the negative input terminal 8 to detect voltage on the resistor element 3'. And laser beams are locally irradiated to evaporate both of resistor film 18 and glass film 19, so as to form a trimming channel 23 (FIG. 10G). This trimming channel 23 narrows current path on the resistor element 3'.

The purpose of this trimming is to adjust the current passing through the LED 2 in the circuit 6A to a specified value (e.g. 20 mA). Thus the in-process resistor element 3' is completed as the first resistor element 3A. To trim the resistor element, the specific current value where a constant voltage is applied to the element can be used as the target.

Trimming for each of the light emitting elements 1B, 1C and 1D is made in a similar way. The external terminals 15Ff and 15 Fe shown in FIG. 5A are used as the terminals to contact trimming probe for the in-process resistor element 3' to be the second resistor element 3B in the component 1B, and the terminals 15Fj and 15Fi shown in FIG. 7A in the component 1C. The external terminals 15Fh and 15 Fg shown in FIG. 5A are used as the terminals to contact trimming probe for the in-process resistor element 3' to be the first resistor element 3A in the component 1B, and the terminals 15FI and 15Fk shown in FIG. 7A in the component 1C. The external terminals 15Fp and 15Fo are used as the terminals to contact trimming probe for the in-process resistor element 3' to be the third resistor element 3C in the component 1D.

When the constant current circuit 6A is electrified or irradiated with laser beams, each of the first and second transistors 5A, 5B and the LED 2 is heated to have potential characteristic change. However for the trimming used in this invention, where a current is applied between the positive input terminal 7 and the negative input terminal 8 shown in FIG. 3A, such characteristic change is taken into account so that high precision trimming is attained.

Figure 12:
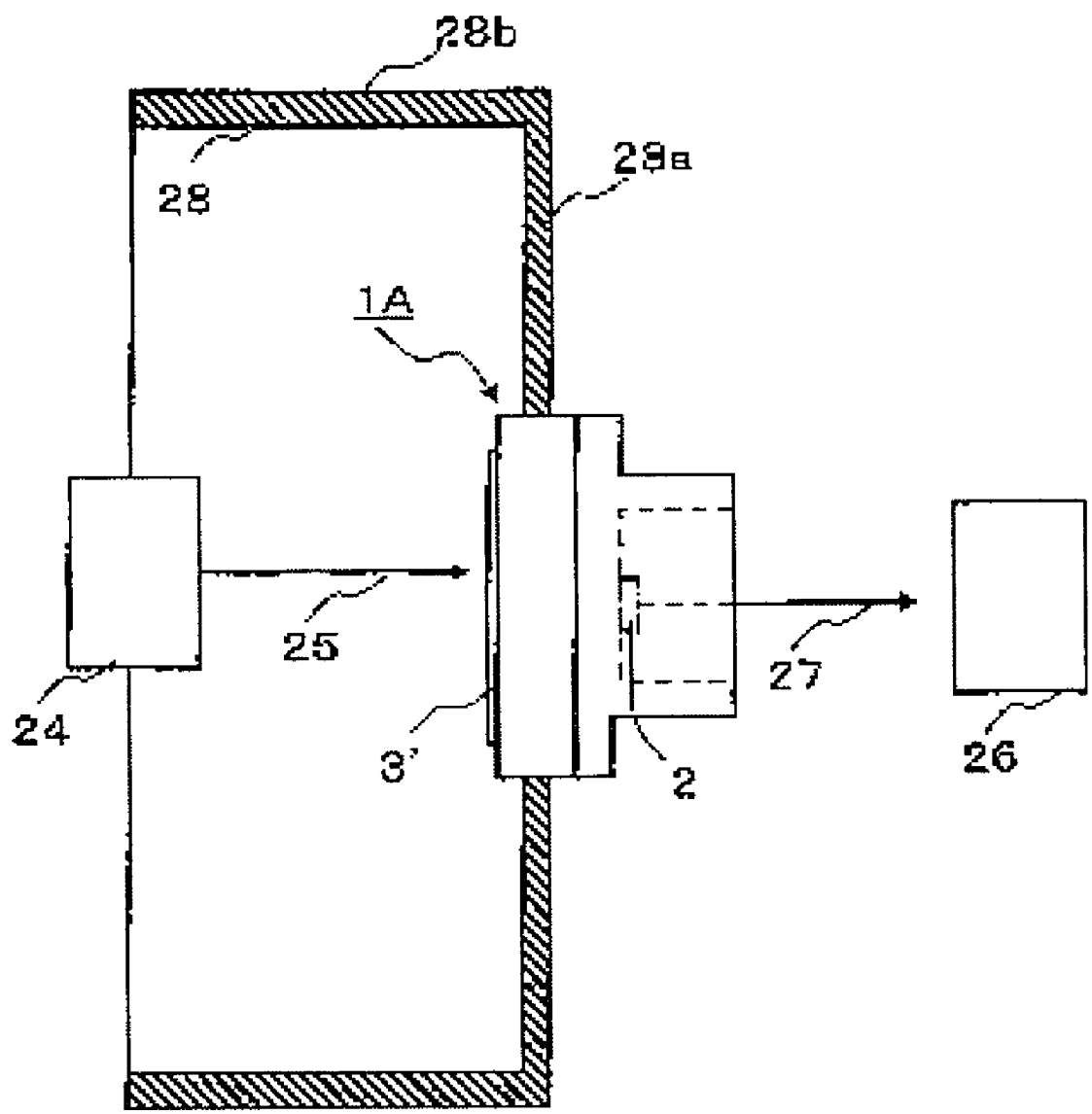
FIG. 12 shows a sketch to illustrate the trimming process of a manufacturing method according to the invention.

In this trimming process, current passing through the first resistor element 3A is measured. Instead, trimming with measurement of light intensity of LED 2 is also available, where the light intensity is used as the measure of trimming completion. A rough sketch of a trimming method with measurement of light intensity of LED 2 is shown in FIG. 12. This figure shows a single component 1A for trimming, but a mother substrate before dividing is actually used in this process.

In the process shown in FIG. 12, in-process component 1A (not trimmed) is operated while laser beams 25 from trimming apparatus 24 are irradiated to in-process resistor element 3' so as to break both of resistor film 18 and glass film 19 and to form a trimming channel 23. Change in intensity of light beams 27 from the LED 2 is detected with a photometer 26. Laser beams 25 are stopped when the aimed light intensity is obtained.

In the foregoing trimming process as well as the process with light intensity measurement described above, it is preferable to provide a shield means (for example shield plate 28 shown in FIG. 12) in advance to protect the surface of the mother insulating substrate with borders 4C with LEDs 2 from external light. The reason of such shield is that scattering of laser beams 25 into the light from LED 2 degrades precision detection of light intensity of the LED 2. Another reason is to avoid deposition of powder of evaporated resistor film 18 and glass film 19 onto the emitting surface of the LED 2, such deposition potential to have adverse impact on the light intensity. Similar effect of the shield plate 28 against vapor deposition prevention is also obtained in the trimming process with measurement of resistance value of the second resistor element 3B, because the back surface of unit substrate with the in-process resistor element 3' is opposite to the surface with the LED 2 and distant each other. Instead of the shield plate 28, vacuum or blow of evaporated powder is also available. For the shield plate 28, cylindrical type can be substituted for rectangular box type, or shield plate 28a without side walls 28b is further available.

The trimming process with measurement of light intensity of LED 2 is more preferable than the trimming with measurement of luminance of LED 2 (disclosed in the patent document 1). Luminance is the brightness of light emitting body per unit area, while the light intensity is the intensity of light beams from a light emitting body equal to luminous flux from the body toward a direction included in unit solid angle. Then light intensity is equal at any distance from light source, while luminance depends on such distance. It is supposed that the distance from light emitting element to photometer is different according to various conditions.

(Overcoat Process)

In this process, overcoat 20 is formed with a resin film of epoxy resin paste to cover over the trimming channels 23 prepared in the trimming process. Screen printing method is preferable to form resin layer into strips in order to cover two resistor elements 3 and two trimming channels 23 (see FIG. 10H). The resin layer is cured under a hot atmosphere. This overcoat 20 doesn't cover the parts where resistor film 18 and resistor terminal 15B overlap each other. It is because if such parts are higher than bumps 21 through covering with overcoat 20, workability of the component degrades.

(Dividing Process)

Dividing process is described here. A physical stress is applied to a mother insulating substrate with borders 4C along with either of vertical or lateral border lines 4B. In this embodiment, such stress is applied along with the lines adjoining thinned part 12B on the mother hollow member 12D. Then the substrate 4C is separated into substrate strips 4E (see FIG. 11 H). In FIG. 11 H, a substrate strip 4B is shown only from the view of unit hollow member 12D side and elements within each penetrating hole 12C are omitted for convenience.

Then each of the substrate strips 4E is applied with physical stress along with remaining dividing lines 12E in the direction to open the lines, thereby each substrate strip 4E is separated into unit substrate 4A with unit hollow member 12. This process is referred to as the secondary dividing process. FIG. 11 I shows only the appearance of the light emitting component 1A, omitting elements within the penetrating hole 12C. This is the end of the dividing process.

To dividing mother insulating substrate with borders 4C into unit substrates 4A, a dicing saw is also available to cut mother substrate 4C along with vertical or lateral border lines 4B. This saw can be used for both of the first and the second dividing processes. Or combination of the dicing saw and physical stress is also available, using the saw for the first dividing and the physical stress for the second dividing. The physical stress method is less expensive. The dicing saw method is applicable with high position accuracy to miniaturized components 1A, 1B, 1C and 1D. In the dicing saw method, the border lines 4B and the dividing lines 12E can be omitted, or invisible lines 4B and 12E are also available.

The thinned parts 12B are only provided along with lateral border lines 4B and dividing lines 12E. To improve accuracy in the dividing process, it is preferable to prepare such thinned parts along with vertical lines as well. However the thinned part 12B doesn't contribute to light emitting function of the light emitting component 1A, so that vertical thinned parts should be removed for miniaturized component 1A.

(Plating Process)

Nickel layer and solder layer are then plated in this order on the surface of the external terminals 15Fa to 15Fd on each unit substrate 4A. These plating steps are performed with the foregoing Barrel Plating Method respectively. Plating conditions for each step including plating time and plating bath temperature are adjusted so that the thickness of each plating layer becomes 3 to 12 μm. This is the end of the plating process and the general manufacturing process of the light emitting component 1A. Each of the light emitting components 1B, 1C and 1D is manufactured in a similar way.

Preferable manufacturing methods for the light emitting components 1A, 1B, 1C and 1D as embodiments of the invention have been described above, and various changes may be made without departing from the scope of the invention. For example, any of the values 1.0, 1.1, 1.2, 1.3, 1.4 and 1.5 can be used as the ratio x/y for the unit substrate 4A. To place multiple light emitting components 1A, 1B, 1C or 1D thickly to make dense arrangement of multiple LED 2, a value between 1.0 and 1.3 is preferable for such ratio.

Each of the light emitting components 1A, 1B, 1C and 1D according to the invention has a single LED 2, but it is also possible to place two or more LEDs 2 in series and/or in parallel on a single component.

Any of the unit hollow member 12, the pad 15C, the light-permeable resin layer 17, the overcoat 10, the bumps 21, the nickel and the solder layers isn't essential to any of the light emitting components 1A, 1B, 1C and 1D according to the invention. Then one or more of these elements can be removed. In manufacturing methods of the light emitting components 1A, 1B, 1C and 1D according to the invention, the sealing process and the plating process aren't essential, and either or both of the processes can be removed. In case of use of LTCC for the substrate 4, the bonding process can be removed since it isn't essential. For preparation of the conductors 15, plating of nickel alloy sheet is also available after formation of thick film layer with screen printing method.

All of the bonding process, the sealing process, the trimming process, the overcoat process, the dividing process and the plating process for the light emitting component 1A are also applicable to a manufacturing method of the light emitting component 1B shown in FIGS. 4 and 5, of the component 1C shown in FIGS. 6 and 7, or of the component 1D shown in FIGS. 8 and 9. It is obvious that the above processes can also be removed in the manufacturing method.

In stead of assembly of elements including the LED 2 after formation of the conductors 15 described in the foregoing manufacturing method, another method is also applicable such that elements including the LED 2 are connected with the gold wires 16 to constitute the constant current circuit 6A or 6B after placement of them on the substrate 4. It is obvious that the above processes can also be removed in the manufacturing method.

In the foregoing embodiments of the invention, all or part of driving circuit elements are arranged around the LED 2 as the light emitting element, and the area should be 180 to 360 degrees in the views of light dispersion and easy connection. The two NPN transistors 5A and 5B are arranged with the rough angle of 120 degrees around the LED 2 on the same side, and the angle range is preferable to be between 90 and 180 degrees for the reason of light dispersion.

In case of arrangement of three or more tall elements around the LED 2, it is preferable to place one or more elements in each of trisected portions with the angle of 120 degrees around the light emitting element. The arrangement of the gold wires 16 is preferably placed over 180 degrees around the LED 2 in the views of light dispersion and easy connection. The arrangement of the gold wires 16 over 240 degrees around the LED 2 is more preferable, since the above effect is enhanced. The above arrangements of driving circuit elements and the gold wires 16 are only applicable to the components without the cavity 13.

Different functions between the external terminals 15Fa to 15Fd for the component 1A, the external terminals 15Fe to 15Fg for the component 1B, the external terminals 15Fi to 15Fk for the component 1C, and the external terminals 15Fn to 15Fo for the component 1D are realized through application of different connection methods. For example, the positive input terminal 7 and the negative input terminal 8 can be prepared at different locations, and the positions to contact trimming probe in the trimming process can also be prepared at different locations.

LEDs have variation in forward voltage (Vf) and it was difficult to adjust luminance to a value even for LEDs produced at the same time. Then a technique to accurately control luminance values of LEDs has been proposed such that LEDs and a driving IC chip are mounted to a substrate and the chip is used to control luminance values of each LED (Published Unexamined Patent Application JP2005/64445). But a light emitting component includes elements other than LED, so that control of LED luminance is insufficient to equalize light intensity level of each LED. On the other hand, a plurality of light emitting components are often used side by side as a light emitting module. Then it is desirable to remove artificiality of illumination from such module with uniform light beams from each LED. For this reason, natural illumination is necessary for such module with multiple LEDs as well as uniform light intensity levels. Each of the light emitting components 1A, 1B, 1C and 1D also has such effect (hereafter referred to as "Effect A").

Each of the light emitting components with the Effect A has a light emitting element (e.g. LED 2) and driving circuit members on the substrate 4, the element placed in the center of the substrate, all or part of the driving circuit members placed around the light emitting element. This construction having the light emitting element in the center of the substrate prevents dislocation of light emitting point where a plurality of light emitting elements are used, resulting in natural illumination. The arrangement of all or part of the driving circuit members surrounding the light emitting element allows light beams from the element reflecting on the members, so that illumination could be stable without concentration of light beams, resulting in reduction of variation in light intensity between the light emitting elements.

On each of the above light emitting components with the Effect A, all or part of the driving circuit members are placed around the light emitting element with an angle over 180 degrees. This arrangement of the driving circuit members surrounding the light emitting element allows light beams from the element reflecting on the members, so that illumination could be stable without concentration of light beams, resulting in reduction of variation in light intensity between the light emitting elements. Such arrangement with the angle over 180 degrees makes light beam dispersion with suppressed light segregation, thereby light emitting point could be widened even if the light emitting element isn't placed right in the center of the substrate. This effect realizes natural illumination for a module with multiple light emitting elements.

In each of the above components with the Effect A, the substrate has a cavity 13, and a light emitting element and all or part of the driving circuit members on the bottom of the cavity. This construction allows light beams from the light emitting element reflecting on the inside wall of the cavity, so that illumination could be stable without concentration of light beams, resulting in reduction of variation in light intensity between the light emitting elements.

In each of the above components with the Effect A, a hollow member is bonded on the substrate, the member having a penetrating hole 12 standing perpendicular to the surface of the substrate, the light emitting element and all or part of the driving circuit members placed in the penetrating hole. This construction allows light beams from the light emitting element reflecting on the inside wall of the penetrating hole, so that illumination could be stable without concentration of light beams, resulting in reduction of variation in light intensity between the light emitting elements.

In each of the above components with the Effect A, the cavity or the penetrating hole is filled with a light permeable resin and the resin exists only within the cavity or the penetrating hole. Then the light emission stabled within the cavity or the penetrating hole is kept as it is without disturbance by the irregular resin overflowed.

Each of the above components with the Effect A has a plurality of resistor elements 3 (including 3A, 3B and/or 3C), all or part of the elements placed on the opposite surface to the light emitting element. This construction with driving circuit members placed on both sides of the substrate realizes high area efficiency to downsize the component.

The above components with the Effect A include driving circuit members all or part of which constitute one of constant current circuits (6A, 6B, 6C or 6D), the circuit having a plurality of resistor elements, two or more of the elements placed on the opposite surface to the light emitting element, all of part of the resistor elements further trimmed resistance value so as to set light intensity of the light emitting element to a specified range. This construction with driving circuit members placed on both sides of the substrate realizes high area efficiency to downsize the component. This construction further facilitates highly stable current output.

Some of the light emitting components 1A, 1B, 1C and 1D with the Effect A comprises a light emitting element (LED 2), resistor elements 3, substrate 4 and transistors 5. The LED 2 and part of driving circuit members (including the transistors 5, conductors 15, pad 15Ca and gold wires 16) are placed on the substrate 4, the LED 2 placed in the center of the substrate 4, all or part of the driving circuit members placed around the LED 2 with an angle over 180 degrees. The transistors 5 could be taller than the LED 2. Each of the light emitting components 1A, 1B, 1C and 1D with the Effect A has cavity 13, and the LED 2 and part of the driving circuit members (including the transistors 5, conductors 15, pad 15Ca and gold wires 16) are placed on the bottom of the cavity 13. Each of the light emitting components 1A, 1B, 1C and 1D with the Effect A has a hollow member 12 with penetrating hole 12C, the penetrating hole being the cavity 13, the hollow member 12 bonded on the surface of the substrate 4, and the penetrating hole 12 standing perpendicular to the surface of the substrate 4 and accommodating the LED 2 and part of the driving circuit members (including the transistors 5, conductors 15, pad 15Ca and gold wires 16) within it. The penetrating hole 12C being the cavity 13 is filled with a light-permeable resin (not illustrated) and the resin only exists within the hole 12C. The driving circuit members include resistor elements 3 placed on the opposite surface to the LED 2. All or part of the driving circuit members constitute a constant current circuit having one or more resistor element 3 with a trimmed resistance value so as to set light intensity of the LED 2 to a specified range.

Each of the light emitting components 1A, 1B and 1C has a plurality of resistor elements 3. Then it is required to trim resistance values of them to control variation in luminance of each light emitting element. These components effectively reduce such variation with the multiple resistor elements. This favorable effect of the light emitting components 1A, 1B and 1C is hereafter referred to as "Effect B."

A manufacturing method of light emitting component having the Effect B comprises assembly process of a light emitting element (e.g. LED 2) and resistor elements 3 (including 3A, 3B and/or 3C) constituting a part of driving circuit for the light emitting element; the first trimming process to trim resistance value of the resistor element for light emitting element; and the second trimming process to trim resistance value of the other resistor element to control current using light intensity of the light emitting element or the current passing through the light emitting element as the indicator. In this manufacturing method, the second trimming process is conducted assuming the actual operating condition so that the resistance value can be trimmed precisely and variation in light intensity between light emitting elements can be reduced.

In the manufacturing method with the Effect B described above, the first trimming process includes measurement of resistance value. A trimming apparatus for existing chip resistors and a mature trimming technology using the apparatus are applicable to this trimming process.

In the above manufacturing method, driving circuit members include positive input terminal and negative input terminal, putting the first transmission line (e.g. 9A) and the second transmission line (e.g. 9B) between the terminals; the first transmission line including a light emitting element, a NPN transistor (e.g. 5, 5A, 5B) and a resistor element for limiting current in order of the positive input terminal, and the NPN transistor having emitter laid closer to the negative input terminal than collector; the second transmission line including a resistor element for light emitting element and a junction in this order from the positive input terminal side, and the third transmission line connecting the junction and base terminal of the NPN transistor. The first trimming process is conducted by trimming resistance value of the resistor element for the light emitting element referring to base terminal voltage of the transistor, and then the second trimming process is made for the other resistor element for limiting current. In this method, the latter trimming is made after the transistor is turned on to ensure electrification of the light emitting element through the first trimming. This method is effective to produce light emitting components with light emitting element on line to connect collector and emitter terminals.

In the above manufacturing method, the light emitting element is placed on the substrate and the resistor element for limiting current is placed on the opposite surface to the light emitting element, before both trimming processes. This procedure allows resistance value trimming under good condition without effect of heat during the trimming on the light emitting element.

In the above manufacturing method, a shield means (e.g. shield plate 28) is provided between the light emitting element and both resistor elements. The shield means prevents powder produced from the resistor elements during trimming from depositing on the light emitting surface of the light emitting element, where laser beams are used for the trimming. The shield means also reduces the effect of scattered laser beams for trimming referring to light intensity of the light emitting element.

In the above manufacturing method, each of the two trimming processes is conducted to provide trimming channel 23 to narrow current path on resistor element, and powder to be produced during the trim is removed. Then deposition of such powder on the light emitting surface of the light emitting element is prevented.

A manufacturing method for light emitting component with the Effect B according to this invention comprises resistor assembly process to place a resistor element for light emitting and the other resistor element for limiting current on the back side of each unit substrate partitioned with crosswise border lines 4B on a mother insulating substrate with borders 4C; the other assembly process to place a light emitting element and a part of light emitting element driver circuit members on the surface of each unit substrate; conductor forming process to form conductors connecting each driving member on each unit substrate to constitute a constant current circuit; the first trimming process to trim resistance value of the resistor element for light emitting on each unit substrate after the assembly and conductor forming processes; the second trimming process to trim resistance value of the resistor element for limiting current referring to the light intensity of or the current passing through each light emitting element in order to set light intensity of each light emitting element to a specified range; and a dividing process to divide the mother insulating substrate into individual unit substrates along with the border lines.

In this manufacturing method, the second trimming process is conducted assuming the actual operating condition so that the resistance value can be trimmed precisely and variation in light intensity between light emitting elements can be reduced. Further each process is conducted for a mother insulating substrate with a plurality of unit substrates partitioned by border lines, so that many light emitting components are efficiently produced. Particularly, separate trimming processes for two resistor elements are effective for resistance value adjustment.

In a light emitting component with the Effect B, a light emitting element is placed on a surface of a unit substrate and resistor elements as part of driving circuit members are placed on the other side of the substrate, each of the resistor elements trimmed with resistance value as the circuit is operated after the placement. Then resistance value can be trimmed precisely and variation in light intensity between light emitting elements can be reduced.

A manufacturing method of the light emitting component 1A having the Effect B is described below. A LED 2 and the resistor elements 3A, 3B constituting a part of the driving circuit for the LED 2 are placed on a surface of a substrate 4. The first trimming process is conducted for the second resistor element 3B for light emitting to trim resistance value. The second trimming process is conducted for the first resistor element 3A for limiting current referring to the light intensity of the current passing through the LED 2. The LED 2 is placed on the surface of the substrate 4 before both trimming processes, and the two resistor elements 3A and 3B are placed on the back surface of the substrate 4 before both trimming processes as well. The first trimming process is conducted referring to resistance value of the second resistor element 3B. Shield plate is placed between the LED 2 and the two resistor elements to separate them spatially. Both trimming processes are aimed to narrow current path on each resistor element. During the trimming processes, powder from the resistor elements is vacuumed. This manufacturing method is also applicable to the light emitting components 1B and 1C.

In the above manufacturing method, the driving circuit members include the positive input terminal 7 and the negative input terminal 8, putting the first transmission line 9A and the second transmission line 9B between the terminals, the first transmission line having the LED 2, a NPN transistor 5A and the first resistor element 3A in order of the positive input terminal, the NPN transistor 5 having emitter terminal closer to the negative input terminal 8 than collector terminal. The second transmission line 9B has the second resistor element 3B and junction 10A in order of the positive input terminal 7, and the third transmission line 9C connects the junction 10A and base terminal of the NPN transistor 5A. The first trimming process is conducted by trimming resistance value of the second resistor element 3B so as to adjust base terminal voltage of the NPN transistor 5A, and then the second trimming process is conducted for the first resistor element 3A. This method is also applicable to the light emitting components 1B and 1C.

For each of the light emitting components aiming at the Effect A or B, constant current circuit isn't essential. A constant voltage circuit is an alternative.

The invention claimed is:

1. A light emitting component on a substrate, comprising:
a light emitting element; and
a constant current circuit including a resistor element, whose resistance value is adjusted so as to set a light intensity of the light emitting element to a specified range, and a circuit including a transistor and/or a diode, the constant current circuit supplying a constant current to the light emitting element, wherein
the light emitting element and at least a part of the circuit including the transistor and/or the diode are disposed on a surface of the substrate and the resistor element is disposed on another surface of the substrate; and
the substrate has a rectangular shape and has a range of a side length ratio x/y between 1 and 1.5, wherein x is the length of a pair of opposite sides and y is the length of the other pair of opposite sides of the substrate.

2. The light emitting component according to claim 1, having a plurality of the resistor elements.

3. The light emitting component according to claim 1, wherein
a hollow member with a penetrating hole is bonded on the surface of the substrate, the penetrating hole standing against the surface of the substrate, and
the resistor element, the transistor and/or the diode are placed within the penetrating hole.

4. The light emitting component according to claim 1, wherein
the resistor element has a resistor film contacting both of paired resistor terminals made of thick film, and
an overcoat laid on the resistor element except the parts of the resistor film contacting the resistor terminals.

5. The light emitting component according to claim 1, wherein
electrical connections of the resistor element with the light emitting element and/or with the circuit including the transistor and/or the diode are provided at a side or sides of the substrate.

6. The light emitting component according to claim 1, wherein
the constant current circuit has a positive input terminal and a negative input terminal, putting a first transmission line and a second transmission line between the terminals,
the first transmission line having the light emitting element, a first NPN transistor and the resistor element in order of the positive input terminal, the first NPN transistor having an emitter terminal laid closer to the negative input terminal than to a collector terminal,
the second transmission line having a second resistor element and a second NPN transistor in order of the positive input terminal, the second NPN transistor having an emitter terminal laid closer to the negative input terminal than a collector terminal;
a third transmission line connecting a base terminal of the first NPN transistor with a first junction between the second resistor element and the second NPN transistor; and
a fourth transmission line connecting a base terminal of the second NPN transistor with a second junction between the first NPN transistor and the resistor element.

7. The light emitting component according to claim 1, wherein
the constant current circuit has a positive input terminal and a negative input terminal, putting a first transmission line and a second transmission line between the terminals, the first transmission line having the light emitting element, an NPN transistor and the resistor element in order of the positive input terminal, the NPN transistor having an emitter terminal laid closer to the negative input terminal than a collector terminal, the second transmission line having a second resistor element and the diode in order of the positive input terminal, the diode having anode and cathode terminals along a direction from the positive input terminal to the negative input terminal, and a third transmission line connecting a base terminal of the NPN transistor with a first junction between the second resistor element and a second NPN transistor.

8. The light emitting component according to claim 1, wherein the constant current circuit has a positive input terminal and a negative input terminal, putting a first transmission line and a second transmission line between the terminals, the first transmission line having the light emitting element, an NPN transistor and the resistor element in order of the positive input terminal, the NPN transistor having an emitter terminal laid closer to the negative input terminal than a collector terminal, the second transmission line having a second resistor element and a Zener diode in order of the positive input terminal, the Zener diode having anode and cathode terminals in the direction from the negative input terminal to the positive input terminal, and a third transmission line connecting a base terminal of the NPN transistor with a first junction between the second resistor element and a second NPN transistor.

9. The light emitting component according to claim 1, wherein the constant current circuit has a positive input terminal and a negative input terminal, putting the light emitting element and an n-channel field effect transistor in order of the positive input terminal between the terminals, the field effect transistor being short-circuited between gate and source terminals through the resistor element.

* * * * *